(12) United States Patent
Charlton et al.

(10) Patent No.: US 9,991,403 B2
(45) Date of Patent: Jun. 5, 2018

(54) OPTICAL DEVICE

(75) Inventors: Martin David Brian Charlton, Southampton (GB); Pavlos Lagoudakis, Southampton (GB); Soontorn Chanyawadee, Samutprakarn (TH)

(73) Assignees: Marvin Charlton, Southampton (GB); Pavlos Lagoudakis, Southampton (GB)

( * ) Notice: Subject to any disclaimer, the term of this patent is extended or adjusted under 35 U.S.C. 154(b) by 676 days.

(21) Appl. No.: 13/201,718

(22) PCT Filed: Feb. 16, 2010

(86) PCT No.: PCT/GB2010/000273
§ 371 (c)(1),
(2), (4) Date: Dec. 21, 2011

(87) PCT Pub. No.: WO2010/092362
PCT Pub. Date: Aug. 19, 2010

(65) Prior Publication Data
US 2012/0112165 A1    May 10, 2012

(30) Foreign Application Priority Data

Feb. 16, 2009   (GB) .................................. 0902569.3

(51) Int. Cl.
*H01L 31/0352* (2006.01)
*H01L 31/0232* (2014.01)
(Continued)

(52) U.S. Cl.
CPC .. *H01L 31/02322* (2013.01); *H01L 27/14603* (2013.01); *H01L 31/0352* (2013.01);
(Continued)

(58) Field of Classification Search
CPC .................................................. H01L 31/0352
See application file for complete search history.

(56) References Cited

U.S. PATENT DOCUMENTS

| 7,642,557 B2 * | 1/2010 | Klimov | B82Y 20/00 |
| | | | 257/79 |
| 2003/0141507 A1 * | 7/2003 | Krames | H01L 33/08 |
| | | | 257/79 |

(Continued)

FOREIGN PATENT DOCUMENTS

| EP | 1798783 | 6/2007 |
| WO | 2007097242 | 8/2007 |

OTHER PUBLICATIONS

Chanyawadee et al., "Multiplying photocurrent by utilising non-radioactive energy transfer in hybrid nanocrystal/patterned quantum well structures", Lasers and Electro-optics, May 4, 2008, 1-2.
(Continued)

*Primary Examiner* — Eugene Lee
(74) *Attorney, Agent, or Firm* — Andrus Intellectual Property Law, LLP

(57) ABSTRACT

An improved optoelectronic device is described, which employs optically responsive nanoparticles and utilises a non-radiative energy transfer mechanism. The nanoparticles are disposed on the sidewalls of one or more cavities, which extend from the surface of the device through the electronic structure and penetrate the energy transfer region. The nanoparticles are located in close spatial proximity to an energy transfer region, whereby energy is transferred non-radiatively to or from the electronic structure through non-contact dipole-dipole interaction. According to the mode of operation, the device can absorb light energy received from the device surface via the cavity and then transfer this non-radiatively or can transfer energy non-radiatively and then emit light energy towards the surface of the device via the cavity. As such, the deice finds application in light emitting devices, photovoltaic (solar) cells, displays, photodetectors, lasers and single photon devices.

27 Claims, 32 Drawing Sheets

(51) Int. Cl.
    H01L 27/146    (2006.01)
    H01L 31/055    (2014.01)
    H01L 33/20     (2010.01)
    H01L 33/50     (2010.01)
    H01L 33/00     (2010.01)
    H01L 33/08     (2010.01)

(52) U.S. Cl.
    CPC .... *H01L 31/035281* (2013.01); *H01L 31/055* (2013.01); *H01L 33/20* (2013.01); *H01L 33/505* (2013.01); H01L 33/0004 (2013.01); H01L 33/08 (2013.01); Y02E 10/52 (2013.01)

(56) References Cited

U.S. PATENT DOCUMENTS

| | | |
|---|---|---|
| 2005/0253152 A1 | 11/2005 | Klimov et al. |
| 2007/0085100 A1 | 4/2007 | Frederic et al. |
| 2008/0017874 A1 | 1/2008 | Erchak et al. |
| 2008/0131987 A1 | 6/2008 | Horino et al. |
| 2008/0211048 A1 | 9/2008 | Rolston et al. |
| 2008/0226903 A1* | 9/2008 | Mishra .......................... 428/336 |

OTHER PUBLICATIONS

Chanyawadee et al., "Efficient light harvesting in hybrid CdTe nanocrystal/bulk GaAs p-i-n photovoltaic devices", Applied Physics Letters, 2009, 94:233502-1-233502-3.

Chanyawadee et al., "Photocurrent Enhancement in Hybrid Nanocrystal Quantum-Dot p-i-n Photovoltaic Devices", Physical Review Letters, Feb. 20, 2009, 102:077402-1-077402-4.

Heliotis et al., "Hybrid Inorganic/Organic Semiconductor Heterostructures with Efficient Non-Radiative Energy Transfer", Advanced Materials, 2006, 18:334-338.

Kraus et al., "Interplay between Auger and Ionization Processes in Nanocrystal Quantum Dots", The Journal of Physical Chemistry Letters, 2005, 109:18214-18217.

Lu et al., "Nonradiative Resonant Excitation Transfer from Nanocrystal Quantum Dots to Adjacent Quantum Channels", Nano Letters, 2007, 7(11):3443-3451.

Nizamoglu et al., "White light generation by resonant nonradiative energy transfer from epitaxial InGaN/GaN quantum wells to colloidal CdSe/ZnS core/shell quantum dots", New Journal of Physics, 2008, 10:1-10.

Tang, "Resonant Energy Transfer from Organics to Quantum Dots and Carrier Multiplication", Power and Energy Conference, APPEEC 2009, 1-4.

UK Search Report for GB0902569.3 dated Jul. 20, 2009.

International Search Report for PCT/GB2010/000273 dated Aug. 5, 2010.

Communication issued for EP10725228.0 dated Sep. 30, 2011.

Response to EP Communication dated Apr. 10, 2012.

International Preliminary Report on Patentability for PCT/GB2010/000273 dated Aug. 16, 2011.

Office Action issued for CN201080016681.0 dated Sep. 22, 2013.

Response to CN Office Action dated Mar. 20, 2014.

Office Action issued for CN201080016681.0 dated Jul. 17, 2014.

* cited by examiner

OPTICAL DEVICE

CROSS REFERENCE TO RELATED APPLICATION

The present application is the U.S. national stage application of International Application PCT/GB2010/000273, filed Feb. 16, 2010, which international application was published on Aug. 19, 2010, as International Publication WO2010/092362. The International Application claims priority of British Patent Application 0902569.3, filed Feb. 16, 2009.

FIELD OF THE INVENTION

The present invention relates to improved optoelectronic devices which employ optically responsive nanoparticles and utilise a non-radiative energy transfer mechanism, and particularly to practical device configurations for improving the efficiency of operation. Such devices include light emitting devices, photovoltaic (solar) cells, displays, photodetectors, lasers and single photon devices.

BACKGROUND TO THE INVENTION

In view of raised global awareness of the depletion of non-renewable energy sources and the associated impact on the environment there is intense interest and highly focused efforts to develop green, renewable energy technologies, and increase the wall plug efficiency of existing technologies where possible.

Approximately 19% of the world's energy consumption is currently attributed to lighting. Present lighting technologies include incandescent lamps, fluorescent lamps, Light Emitting Diodes and Organic Light Emitting Diodes. Various factors impact wall plug efficiency. Overall performance of each technology is now briefly reviewed:
Light Emitting Technologies Conventional LEDs are based on a semiconductor heterostructure grown on a planar substrate. Upon application of a potential difference across the heterostructure, electron hole pairs (exitons) are generated in the junction regions of the epitaxial heterostructure which then recombine after a short time delay (relaxation time) generating a photon with energy equal to the electronic band gap of the heterostructure.

Conventional LEDs can be fabricated from a number of different semiconductor materials. Due to the dependence upon the intrinsic band gap energy the wavelength of emission is primarily related to the choice of this material. Common materials for conventional LEDs include: GaN, InP, GaAs. To a small degree the wavelength of emission can be adjusted by inducing and controlling strain in the epitaxial heterostructure which induces a change in relative energy levels of the band structure either side of the junction region. This technique has for example been employed in GaN based LEDs to obtain green emission whereas the natural band gap energy would lie in the blue part of the spectrum.

Loss mechanisms in conventional LEDs include factors affecting internal quantum efficiency (IQE) (efficiency of conversion of electrons to photons) and light extraction efficiency. Factors relating to internal quantum efficiency include: quality of the epitaxial layers (defect denisities), resistivity of the electrical contacts, and change in strain due to localised heating of the layers (heat extraction).

In a conventional LED it is desirable to maximise radiative emission resulting from recombination of exiton pairs in MQW layers. This in turn relates to improvement of the internal quantum efficiency (IQE) of the epitaxy structure. To obtain high IQE, the epitaxial heterostructure must be substantially monocrystaline and have a low epitaxial defect density. Epitaxial defects in conventional LEDs can include point, thread and dislocation defect types. To reduce defect density the epitaxial layers must be matched in lattice constant to an underlying substrate material which further places constraints on their design and impact cost. Considerable efforts have been made to relieve substrate dependent growth issues resulting in a variety of LED epitaxial configurations.

By way of example, one of the most basic conventional blue LED designs (known as a lateral current spreading design) comprises a GaN layer grown directly onto a sapphire substrate. A thick undoped seed layer is first deposited onto the substrate to improve lattice matching to the sapphire. After some distance growth conditions are changed to create successive n- and p-doped layers with quantum wells sandwiched in-between forming the junction regions. A transparent conductive current spreading layer is then deposited on top of the device to improve electrical conductivity of the top p-GaN layer. Non-transparent metal contact stacks are then deposited onto this which subsequently mask part of the light emitting area and thus reduce efficiency of the device. Sapphire (which is well lattice matched to GaN) is a poor heat conductor and so such devices of this design suffer reduced lifetimes, if driven at the very high current densities which are required for general lighting applications. Additionally, the necessity for a thin optically transparent top current spreading layer places constraints on the achievable contact resistance, and therefore on electrical efficiency of the device.

Another common configuration is known as a "vertical current spreading design". This overcomes lattice mismatch issues and provides for improved heat extraction and reduced electrical contact resistance. In this case the epitaxial layers are grown on a sacrificial substrate then bonded onto a metallic (or high thermal conductivity) substrate, and released from the sacrificial growth substrate to form an n-side up device with improved heat transfer properties to the underlying substrate. In addition the metal substrate provides a reflective mirror improving light extraction efficiency.

Other methods of improving epitaxial growth quality include use of patterned or templated substrates whereby the positions of initial growth are pre-seeded by photo-lighography, templates or nano-particles. In this case, strain can be relaxed at the substrate/semiconductor interface, and in extreme cases arrays of individually isolated quantum wires can be grown (nano-GaN). In the case of patterned substrates the resultant voids help improve light extraction by providing further scattering centres.

As described in Nishida, T.; Saito, H.; Kobayashi, N. *Applied Physics Letters* 2001, 79, (6), 711-712, the best in class (vertical) GaN-based LEDs achieve an internal quantum efficiency of 80%.

A key intrinsic problem for conventional LEDs is the issue of poor light extraction efficiency. Due to the relatively high refractive index of common semiconductor materials combined with the fact that light is generated deep within the epitaxial structure, Fresnel reflection at the semiconductor/air interface causes confinement of a large proportion of the radiated energy. Hence, most of the light generated in the structure does not come out but gets recycled internally. This factor severely limits the wall plug efficiency for conventional LEDs.

Several methods can be employed to improve light extraction from a conventional LED. All attempt to overcome Fresnel reflection loss at the surface/air interface. The most common technique is to utilise random surface texturing to provide random scattering centres for trapped light such that photons eventually become directed into rays propagating within the normal extraction cone of the structure, which is in fact how the patterned substrate technique works. Random texturing can be induced either during epitaxial growth, or by subsequent electro-chemical etching. In both cases the positions of the random structures are seeded by epitaxial defect sites, and hence this technique is not compatible or beneficial with very high quality low defect density epitaxy. Thus, there exists a further trade off between IQE and External Quantum Efficiency (EQE).

An alternative method is to utilise periodic pattering in the form of a photonic crystal lattice etched some way into the hetero-structure. In this case the photonic crystal provides an engineered leakage mechanism for confined photons (which still reside in the high index material surrounding the holes) by redirecting confined modes to leaky radiating modes, and actually re-shaping the extraction light cone, for example changing Fresnel reflection conditions at the top surface in a more complex way.

In the case of surface patterning of any kind it is extremely important that the etched structures do not perforate the quantum wells otherwise an electrical conduction path is created allowing short-circuit (shunting) of the device upon application of the current spreading layers, or alternatively increasing the leakage current which is undesirable since it reduces IQE.

Although the wavelength properties of conventional LEDs are intrinsically restrained by the available semiconductor materials for their fabrication, the emission wavelength range can be extended by use of secondary absorbers and emitters. For example, it is common practice to place a phosphor layer in close proximity to the LED surface such that blue photons emitted from the underlying LED become absorbed by a phosphor and then re-emitted at a different wavelength.

This scheme is reliant upon an optical process whereby the absorption spectrum of the phosphor must overlap the emission spectrum of the LED. Although the efficiency of wavelength conversion for an absorbed photon within a phosphor is extremely high (>85% typically), phosphors are generally made from very high refractive index semiconductor materials aggregated into clusters of particles. Photons incident upon the phosphors are therefore subject to further Fresnel reflection which again severely inhibits the efficiency of photon absorption to the phosphor. Hence the efficiency of the overall process is still quite low. In addition it is very difficult to find phosphors with all the correct properties to cover certain colour ranges, and so the wallplug efficiency of phosphor-converted LEDs varies considerably with colour. There are further lifetime issues associated with differential aging rates for mixtures of phosphors, which results in colour temperature shifts as well as heat related reduction in efficiency.

OLED devices utilise a very different device configuration than conventional LEDs, whereby a thin emissive layer of small organic molecules is sandwiched within a transparent conductive polymer stack forming a diode, which is subsequently terminated by transparent electrodes at the top and bottom. This provides electron hole pairs in the vicinity of the emissive layer under the application of an electric field which become channeled into organo-metallic emitters.

OLED devices overcome some of the intrinsic loss issues associated with conventional LEDs, but suffer from issues of limited lifetime. They have the advantage of being compatible with low cost manufacturing techniques and flexible substrates. Multiple layers can be utilised to modify the overall colour output of the device.

Light Harvesting Technologies

Solar energy harvesting devices commonly utilize the photovoltaic effect to harness solar energy by converting sunlight to electricity with minimal expense to greenhouse gases, production of major pollutants or depletion of non-renewable sources. For photovoltaics (PVs) to become the preferred solution for generating clean energy, the production cost has to be comparable to that of alternative sources and the environmental impact of fabrication should not exceed the energy payback, as described by K. Knapp and T. Jester in Sol. Energy 71, 165 (2001) and G. Peharz, and F. Dimroth in Prog. Photovoltaics 13, 627 (2005). These requirements raise the demand for PVs of ever higher light-to-current conversion efficiency. Solar cells have evolved over three technology generations. We now briefly review current state of the art in this field.

First generation PV cells consist of a single large area semiconductor P-N junction, typically monocrystaline Silicon. Photons impinging on the surface penetrate a small distance into the junction region between the n- and p-doped semiconductor materials where absorption causes the promotion of electrons from the valance band to the conduction band. Provided the generated electron-hole pairs are able to diffuse across the junction region before recombination, this then gives rise to an electrical current. Collection efficiency is therefore dependent upon carrier lifetime recombination distance in the material.

Metal contacts are arranged in inter-digitated arrays to conduct the current away from the cell. Efficiency is limited by the fact that absorption only occurs efficiently over a limited spectral range for photons with energies above the semiconductor band gap energy. Photons with energies below the band gap energy become absorbed by the material by excitation of phonons generating heat. Excess energy exceeding the band gap energy is also lost as heat for photons with higher than band gap energies.

Second generation solar cells utilise improved thin film semiconductor materials such as Cadmium Teluride, copper indium gallium selenide, Amorphous Silicon and Micro-Amorphous Silicon to reduce cost of manufacture.

Third generation solar cells utilise a range of advanced technologies to increase efficiencies. These include multi-junction solar cell configurations, whereby multi-layer structures incorporating several p-n junctions fabricated from different semiconductor materials with slightly different band gap energies, such that each junction region is tuned to absorb a slightly different portion of the solar spectrum. Material sequences such as GaInP, GaAs, and Ge have been used and triple junction devices have achieved a practical efficiency of 40.8%. In triple junction configurations the highest band gap energy occurs higher up in the structure such that photons with energy below that band gap penetrate further to underlying junctions, which then have successively smaller band gaps. Fabrication of triple junction solar cells is extremely difficult due to the requirement for precise lattice matching between successive material layers during epitaxial growth procedures. This also affects choice of substrate materials and in practice Germanium is a suitable substrate material for GaInP, GaAs and InGaAs. InP substrates are under investigation. In addition, as electrical contact between the junction regions is in series, the current through all junction regions must be equal. There are therefore issues associated with differing maximum power handling capabilities for the successive junction regions which reduce maximum attainable efficiency.

An issue for all of the above described PV solar technologies is the reduction of optical loss. First to third Generation PV solar devices are all based on Semiconductor materials on which have a relatively high refractive index materials and give rise to Fresnel reflection loss at the air/semiconductor interface upon incidence of a photon. Random surface texturing is commonly used to reduce the effect of Fresnel loss or rather to increase the acceptance cone angle of the material. Optical collectors are also used to concentrate incident light onto solar cells and thereby increase their efficiency.

Currently, the preferred routes to mass scale fabrication are single crystal ($1^{st}$ generation) or polycrystalline ($2^{nd}$ generation) silicon-based PVs with power conversion efficiency ranging from 10-18%, whereas recent advances in multi-junction p-i-n PVs ($3^{rd}$ generation) have reached lab-reported efficiencies approaching 40%, as detailed in R. R. King et al., Appl. Phys. Lett. 90, 183516 (2007).

Dye-sensitized and nanocrystal quantum dot (NQD)-sensitized PVs provide alternative solar power technologies with the benefit of: simpler fabrication, high absorption, widely tunable spectral absorption, and low-cost synthesis. Although the thermodynamic limit of single band gap photovoltaic cells restrict the cell efficiency to 31%, the efficiency of colloidal NC photovoltaic cells up to 60% is possible.

Non-Radiative Energy Transfer Approach

A way to bypass the inefficiencies and limitations associated with electrical injection in light emitting devices and PV cells as described above, is to engineer devices that utilize alternative pumping schemes to electrical injection and transport, but which still benefit from the brightness, high absorption, and widely tunable spectral range of the organic dyes and NQDs. In nature, as first studied by Förster (T. Förster, Annalen der Physik 2, 55 (1948), no 9), transfer of energy between chromophores predominantly occurs through a nonradiative dipole-dipole coupling mechanism (where donor emission overlaps with acceptor absorption), which does not involve charge transfer or emission and absorption of photons between donor and acceptor, and which can exceed the radiative energy transfer routinely used in phosphor light emitting devices.

Experimental evidence of the non-radiative energy transfer process has been observed in hybrid semiconductor heterostructures under excitation between carriers in a single semiconductor quantum well and a vicinal layer of colloidal semiconductor quantum dots [M. Achermann et al., Nature 429, 642 (2004), and Š. Kos, et al, Physical Review B 71, 205309 (2005)] or organic molecules [G. Heliotis et al., Adv. Mater. (Weinheim, Ger.) 18, 334 (2006), and S. Blumstengel et al., Phys. Rev. Lett. 97, 237401 (2006)]. Energy transfer efficiencies as high as 60% have been achieved [S. Rohrmoser et al., Appl. Phys. Lett. 91, 092126 (2007)], thereby exceeding that of traditional radiative energy transfer where the donors emit photons and the photons are subsequently absorbed by the acceptors. Non-radiative energy transfer rate ($k_{ET}$) scales linearly with spectral overlap and is proportional to $R^{-C}$ where R is donor-acceptor distance and C is a constant. For example, C=2 and 6 describes energy transfer in layer-layer and isolated dipole-dipole systems, respectively [S. Coe et al., Nature 420, 800 (2002) no. 4, and Q. Sun et al., Nat. Photon. 1, 717 (2007) no. 5]. To increase the energy transfer rate, the donor-acceptor separation distance has to be minimised.

In the context of a light emitting device, a non-radiative and non contact energy transfer process can be utilised to excite exciton pairs in light emitting particles (such as Quantum dots or phosphors) placed in close proximity to a Quantum well, which then decay radiatively, thereby creating a Light Emitting Device.

In the case of a Light Emitting Device, electron-hole pairs (excitons) are generated within an epitaxial heterostructure (which for purpose of example can be considered to be similar to any of the conventional Light Emitting Diode (LED) heterostructures described above) by application of a potential difference, or voltage. However, in contrast to a conventional LED, rather than decaying by process of radiative recombination, exitons subsequently generated in the Quantum well layer transfer their energy to light emitting particles placed in close proximity by a process of non-radiative non-contact Forster type dipole-dipole interactions, rather than direct wavefunction overlap, before they have time to decay within the heterostructure region by a process of direct non-radiative recombination. Therefore, instead of emitting photons within the heterostructure, in which case the photon has energy equal to the band gap energy of the epitaxial heterostructure, charge is very efficiently transferred to light emitting nano-particles (placed in close proximity to the quantum well) which then subsequently emit a photon with energy corresponding to the bandgap energy of the nano-particle, rather than the heterostructure.

The light emitting particle could comprise a Semiconductor Quantum dot or a phosphor. Quantum confinement effects can be utilised within such nanoparticles to modify the radiative wavelength beyond that of the bulk material. In this way quantum dots fabricated from a given semiconductor material may emit at a range of wavelengths dependent upon the absolute size and shape of the particles.

In contrast to phosphor converted LEDs (which work by optical energy transfer to the phosphors and are subject to further Fresnel reflection loss at the phosphor/embedding matrix material interface) the non-radiative energy transfer arrangement has the advantage of low energy loss providing very efficient excitation of light emission from the emitting particle. Greater than 80% efficiency for non-radiative electrical energy transfer process is possible as opposed to ~5% for optical energy transfer process to phosphors. In addition, the colour of emission can be controlled by changing the composition of the light emitting material. For example, mixtures of different sized and/or shaped quantum dots would give rise to multicoloured emission. In the case of an LED, the electronic band gap of the light emitting material (quantum dot or phosphor) must be smaller in energy than that of the proximal epitaxial heterostructure.

Since fabrication technology for GaN-based LEDs and the synthesis of semiconductor colloidal nanocrystals (NQDs) is very mature, hybrid colour converted NQD-GaN LEDs are promising candidates for highly efficient multi-colour lighting. The high quantum yield and photostability of colloidal NQDs offer the possibility to create flexible, low cost, large area, and easily manufactured optoelectronic devices, while their emission colour can be tuned over the visible to near infrared range by either changing their size or chemical composition.

Recently, attempts have been made to demonstrate a Nano Quantum Dot LED, as described in S. Lu, and A. Madhukar, Nano Lett. 7, 3443 (2007). In this device a thin NQD layer deposited on an LED surface absorbs the high energy photons that are electrically generated in the LED and subsequently re-emits lower energy photons. As a result, there is no charge transfer among colloidal NQDs involved in this colour conversion process. The efficiency of radiative energy transfer in this case is relatively low due to several energy loss steps in the transfer process, i.e. the waveguided leaky mode losses, light scattering from the NQDs, and the reduced efficiency of emission in the blue, absorption and reemission from the NQD layers.

Non-radiative energy transfer mechanisms can also be applied to a solar energy collection device (photovoltaic cell). In this case materials must be chosen such that the electronic band gap energy of the nanoparticle is larger than that of the proximal epitaxial heterostructure. In this case the phosphor or quantum dot instead behaves as a light absorbing material, generating an electron-hole pair upon absorption of an incoming photon. The electron-hole pair is then transferred back to the epitaxial structure where it induces an electrical current. The light emitting particles can again be a mixture of various sized phosphor or quantum dots, whose overall absorption spectrum can be tuned to that of the solar spectrum by size, shape and mixture selection.

Notwithstanding these developments, a practical issue limiting efficient realisation of both light emitting and light harvesting applications of non radiative energy transfer processes is the requirement to bring the light emitting/collecting particle into close proximity to the heterostructure, while still providing suitable conduction channels to the energy transfer region. For example, in the case of a colloidal NQDs/multiple quantum well LED configuration, the present received wisdom is that the quantum well barrier and the top contact layer must be as thin as possible, while remaining thick enough in order to minimise surface recombination of injected carriers and to allow for uniform spreading of the injected carriers over the active layers (current spreading). As a consequence, an undesirable tradeoff exists between these requirements.

Thus, as will be appreciated by those skilled in the art, there is a need for improved optoelectronic devices and device configurations which overcome the problems described above and facilitate more efficient operation.

SUMMARY OF THE INVENTION

According to a first aspect of the present invention, there is provide an optical device having a surface for receiving light energy or for transmitting light energy, the device comprising:
   an electronic structure having an energy transfer region, wherein the electronic structure exhibits an electronic band gap with an associated energy;
   a cavity extending from the surface of the device through the electronic structure and penetrating the energy transfer region, the cavity having a predetermined cross-sectional shape with one or more corresponding sidewalls extending from the surface of the device through the electronic structure; and,
   an optically responsive particle disposed on one of the cavity sidewalls in close spatial proximity to the energy transfer region, the optically responsive particle being adapted for:
      absorbing light energy received from the device surface via the cavity and for emitting light energy towards the surface of the device via the cavity; and,
      energy transfer with the energy transfer region using a non-radiative energy transfer mechanism,
   whereby light energy absorbed by the optically responsive particle is transferred non-radiatively to the electronic structure via the energy transfer region through non-contact dipole-dipole interaction or whereby energy transferred non-radiatively to the optically responsive particle from the electronic structure via the energy transfer region through non-contact dipole-dipole interaction is emitted as light energy by the optically responsive particle.

In many embodiments it is preferred that a plurality of optically responsive particles is disposed on one or more of the cavity sidewalls in close spatial proximity to the energy transfer region. The particles may be discrete or may be contained within a host matrix.

The device surface defined here need not be the final outer surface of the device form through which light leaves or enters the device. The surface merely relates to refractive index boundary in the device. Thus, a passivation layer or the like may be formed on top of the surface in question.

The present invention relates to device configurations which optimise light extraction or collection per unit surface area via improvement of the efficiency of non-radiative energy transfer, and via an increase in number of carriers (exciton pairs) actively involved in the light emission or collection process. Crucially (and in contrast to prior art) the present invention involves the utilisation of a shaped cavity (or cavities) formed through the structure, which permit optically responsive nanoparticles to be deposited onto the side wall(s) of the cavity such that nanoparticles are disposed around an internal perimeter of the cavity in very close proximity (or contact) to the energy transfer region where the non-radiative energy transfer takes place. As will be described, this approach allows the cavity (or cavities) to be configured for optimal performance in respect of a number of device parameters. Where the cavity, or cavities, contains a single optically responsive particle, the device can operate as a single photon device, either in an emitting mode or in an absorbing (detecting) mode of operation.

Preferably, the device the electronic structure comprises an epitaxial structure. In some embodiments the electronic structure comprises at least one p-n junction having a depletion region in the vicinity of the energy transfer region. However, it is preferred that the electronic structure comprises a semiconductor heterostructure including one or more quantum wells which provide for high mobility charge transfer in the vicinity of the energy transfer region. Preferably, the plurality of optically responsive particles is disposed in close spatial proximity to the one or more quantum wells.

The electronic structure may comprise a direct band gap semiconductor material, or alternatively an indirect band gap semiconductor material.

Preferably, the optically responsive particle(s) comprises a direct band gap semiconductor material and has a well defined shape. In some preferred embodiments, the optically responsive particle comprises a quantum dot or a quantum rod. Such particles cooperate well with an electronic structure comprising one or more quantum wells. Crucially (and in contrast to prior art) this embodiment of the present invention involves the utilisation of shaped cavities formed (etched) through the quantum wells such that they become perforated. The nanoparticles are then deposited along an internal perimeter of the side wall of each cavity, such that they are in very close proximity (or contact) to the quantum well. This arrangement allows participating nanoparticles to be placed within 10 nm of the Quantum well, which is not practically obtainable by previously known means. The optically responsive particle may comprise a colloidal nanoparticle.

The optically responsive particle may take other forms and may comprise a phosphor. For example, thee optically responsive particle may be spherical in shape and/or may comprise a tetrapod. In this case, the optically responsive particle may comprise a spherical core of a given semiconductor material and a spherical shell of another semiconductor of smaller or larger band gap. Alternatively, the optically responsive particle may comprise a spherical core of a given semiconductor material and an elongated rod-shaped shell of another semiconductor of smaller or larger band gap. In another embodiment the optically responsive particle may comprises a spherical shell of a given semiconductor material and four extensions of a different semiconductor of smaller or larger band gap comprising a tetrapod.

In certain embodiments, the sidewalls of the cavity extend through the electronic structure perpendicular to the device surface. In this case the length of the internal cavity wall perimeter matches that at the surface of the device. However, the sidewalls may deviate from being straight. For example, the sidewalls of the cavity may be tapered, particularly if formed by certain etching processes. Alternatively, the sidewalls of the cavity may be curved. Indeed, the whole cavity below the device surface may have a spherical or ellipsoidal shape, which can be beneficial in collecting and directing light energy within the cavity.

The predetermined cross-sectional shape of the or each cavity may be a regular shape or may be irregular. Preferably, the predetermined cross-sectional shape of the cavity is a shape which optimises a length of its perimeter. For example, the predetermined cross-sectional shape may be a simple or convoluted spiral shape or may be a star shape. Alternatively, or in addition, the predetermined cross-sectional shape may be fractal along its perimeter to maximise the internal cavity wall perimeter along which the optically responsive particles may be disposed.

Although the device electronic structure may comprise a single cavity, in many embodiments it is preferred that the electronic structure comprises a plurality of said energy transfer regions and a plurality of said cavities, each cavity extending from the surface of the device through the electronic structure and penetrating one of the energy transfer regions, each cavity having a predetermined cross-sectional shape with one or more corresponding sidewalls extending from the surface of the device through the electronic structure, wherein one or more of the optically responsive particles is disposed on one or more of the cavity sidewalls of each cavity in close spatial proximity to the respective energy transfer region.

The presence of many such cavities and corresponding energy transfer regions allows for many more degrees of freedom in optimising device performance.

In some embodiments the plurality of cavities is arranged randomly across the surface of the device. In some embodiments the plurality of cavities is arranged in a periodic array across the surface of the device. The plurality of cavities may then comprise a photonic crystal. In yet other embodiments the plurality of cavities is arranged in a quasi-periodic array across the surface of the device. The plurality of cavities may then comprises a photonic quasi-crystal. For avoidance of doubt quasi-periodic lattices include those whose Fourier transform of the centre positions of the shaped structures, reveals a level of symmetry larger than 6. Random arrangements include those with non uniform centre-to-centre spacing as a function of spatial position across the patterned area between nearest neighbour shaped structures. It may also mean structures with regular centre-to-centre spacing, but with different perimeter length for the shaped cavity structures.

It is generally preferred that the plurality of cavities is arranged to optimise their packing density across the surface of the device. Preferably, the plurality of cavities is arranged across the surface of the device such that the spacing of nearest neighbour cavities is less than or equal to approximately twice the non-radiative carrier diffusion length of the electronic structure.

The optical device may comprise other layers or materials, including a device substrate. In particular, the device may comprise a non-transparent electrical contact layer disposed over the surface of the device other than the or each cavity. This facilitates very good local electrical connection.

As has been described, the optical device according to the present invention may operate as a light emitting device or as a light energy harvesting device. We therefore consider the more specific features and arrangements of the device when configured for these two modes of operation.

According to a second aspect of the present invention, a light harvesting device comprises an optical device according to the first aspect, wherein the electronic band gap energy of the electronic structure is smaller than an electronic band gap energy of the or each optically responsive particle whereby, when light having a suitable photon energy is incident on the device, light energy is absorbed by the or each optically responsive particle and is transferred non-radiatively to the electronic structure via the energy transfer region through non-contact dipole-dipole interaction, thereby generating an electric potential.

Preferably, the or each cavity is configured to direct light received from the device surface onto the or each optically responsive particle. The or each cavity may be configured to induce and localise surface plasmons on the cavity sidewalls in the vicinity of the light responsive nanoparticles and the respective energy transfer region, thereby improving collection efficiency of incident photons In some embodiments it is preferred that, when the light harvesting device has a plurality of cavities, these are arranged and configured to permit cross-coupling effects therebetween, whereby the device is optimised for receiving and collecting light having a predetermined far-field optical profile. The optimal optical profile of light received by the device may be Lambertian, bat-wing or another profile.

A light harvesting device of the present invention may simply be used to harvest light in order to generate electricity. However, the device has equal application in imaging devices and detectors, including charge-coupled devices (CCDs). A particular application of the invention is in extending or converting the wavelength response range of existing devices to longer wavelength ranges. For example, existing photodetecting or imaging devices, which generally respond in the visible or near infra-red wavelength, may be adapted with the structures of the present invention, whereby they become responsive to longer infra-red wavelengths, including far infra-red. This is particularly useful for silicon based devices, in which the sensitivity ordinarily drops rapidly in the near infra-red. The invention may also be applied to InGaAs-based devices, for example, which are currently inefficient. Moreover, the present invention may be employed to flatten the optical response of such devices, especially when extending or shifting the wavelength responsive range.

According to a third aspect of the present invention, a light emitting device comprises an optical device according to the first aspect, wherein the electronic band gap energy of the electronic structure is greater than an electronic band gap energy of the or each optically responsive particle whereby, when an electric potential is applied to the electronic structure, energy is transferred non-radiatively to the or each optically responsive particle from the electronic structure via the energy transfer region through non-contact dipole-dipole interaction is emitted as light energy by the or each optically responsive particle.

Preferably, the or each cavity is configured to act as a reflector for reflecting light emitted by the or each optically responsive particle towards the surface of the device. A depth of the or each cavity in the electronic structure may be selected to optimise transmission of light from the or each optically responsive particle towards the surface of the device.

When the refractive index of the proximal heterostructure is large, a large proportion of emitted light is reflected back from the side walls of the shaped structures due to Fresnel reflection at the low to high refractive index boundary at the surface interface, such that each shaped structure acts predominantly as a reflective cavity for light emitted from the nano-particle. Hence, light initially radiated towards the proximal heterostructure becomes redirected toward the forward emission direction. Directionality of the forward emitted light can be controlled by sculpturing the cross sectional profile of the enclosing shaped structure.

In some embodiments where the light emitting device has a plurality of cavities, it is preferred that these are arranged and configured to permit cross-coupling effects therebetween, whereby the device emits light having a predetermined far-field optical profile. The far-field optical profile of light emitted by the device may be Lambertian, bat-wing or another profile.

In some embodiments of the light emitting device the plurality of cavities are configured to enhance emission rate via partial coupling and transmission to underlying substrate modes. The plurality of cavities may also or alternatively be configured to enhance emission rate via cross coupling between surface Plasmon modes on the surface of the device and the side walls of the cavities.

Such cross coupling is not limited to nearest neighbour interactions but could occur for example over the length scale of several microns (similar to a photonic crystal). Such cross coupling could be achieved via partial coupling of emitted optical fields to the bulk of the dielectric material of the proximal heterostructure. Alternatively, cross coupling could be achieved entirely external to the bulk of the proximal heterostructure via coupling to surface plasmons which propagate and/or resonate between cavities Thus, these embodiments of the invention provide means to modify the shape of the far-field emission from a large area device without the need for lenses, and means to improve the emission rate. The shape of the cavities can selected such that the Quality factor of the cavity becomes large. In this way, the cavities may provide a "microcavity" environment for the enclosed optically responsive particles, which stimulates further emission from the nano-particles via optical reabsorption, thereby increasing the overall rate of emission. Taken to the extreme, this increased emission rate may lead to stimulated emission and lasing within the shaped cavity structures.

In the present invention, the geometry of the shaped cavities, including width, depth and pattern, determine the emission profile of the overall device. This is in contrast to the case for conventional LEDs and photonic crystal LEDs, where the overall epitaxy thickness and relative position of the QWs is critical in determining the emission properties. Moreover, the present invention operates in a distinctly different manner to light emission in photonic crystal (PC) LED devices. In the present invention light emission occurs within the etched shaped cavity structures and is completely external to the bulk of the heterostructure. Here the cavity structures predominantly act as reflectors, and so overall there is little light coupled to or trapped within the bulk of the heterostructure. By comparison, in the case of a conventional PC-LED, light emission is internal to the bulk of the heterostructure material, and the shaped structures perform the function of providing leaky modes to redirect confined modes to radiation modes, thereby providing an extraction mechanism for confined modes. However, PC techniques may be employed in the present invention for beneficial beam shaping.

Furthermore, in a conventional PC-LED device where the overall epitaxial thickness is several microns, then tens or even hundreds of modes contribute towards the overall radiated far field profiles. In the present invention the number of modes contributing to or involved in the emission process (or collection for light harvesting) is limited or determined by the depth and width of the enclosing shaped structures, thereby simplifying optical design of the structures and allowing unusual beam patterns to be easily obtained. In the case of a light emitting device, such beam patterns could include high directionality (reduced angular cone), uniform intensity far fields or structured far field patterns such as extreme bat-wings. Such beam profiles are beneficial for applications such as display and general lighting.

A significant advantage of the devices of the present invention is that the upper surface of the device may be coated with an optically opaque metal contact layer with the shaped cavity structures disposed through this top contact layer and the underlying heterostructure. In contrast to conventional LEDs and OLED devices, this allows the top contact stack to be arbitrarily designed, in terms of material used, to minimise contact resistance to the underlying heterostructure, thereby providing means of improvement in electrical contact to the bulk of the heterostructure, which further improves overall efficiency of generation of contributory exciton pairs in the Quantum Well layers.

As light emission is entirely from within the shaped cavities, the interconnecting top surface (between adjacent cavities) can be covered by an optically opaque and physically thick solid metal layer, allowing the top contact stack structure to be arbitrarily designed to minimise contact resistance to the underlying heterostructure. In a conventional LED device, the top contact must either be entirely transparent, or must be small in area and used in conjunction with an underlying partially conductive current spreading layer. This requirement constrains the ultimate contact resistance which can be obtained to the heterostructure and limits overall efficiency of the LED (increased forward switch on voltage). The same considerations apply to the device when used as a light energy harvester.

As will be appreciated by those skilled in the art, light emitting devices according to the present inventions may be employed in a wide range of applications. A particular example is in an optical display, which would generally comprise an array of light emitting devices of the present invention. More efficient operation with lower heta generation would be possible.

According to a fourth aspect of the present invention, a method of fabricating a device according to the fist, second or third aspect comprises the steps of:

providing the electronic structure having the surface; and,
forming the or each cavity extending from the surface through the electronic structure by a pattering process.

Preferably, the patterning process comprises the steps of lithography and etching, although other patterning techniques may be used.

The method may further comprise the step of depositing a passivation layer. Examples of passivation layers include: Hafnium oxide, Aluminium Oxide or other dielectric materials which could be deposited by a process of atomic layer deposition, sputtering, or thermal evaporation. Alternatively, self-assembled monolayers could be applied.

For many applications it is preferred that the method further comprises the step of depositing a non-transparent electrical contact layer over the surface of the device other than the or each cavity.

As will be appreciated by those skilled in the art, the present invention provides for significantly improved optoelectronic devices. The use of optically responsive particles permits the light generating/absorbing function to be separated from the electrical driving/generating function, which when combined with the use of innovative shaped cavity structures provides for wide design possibilities and device functionality. Each facet of the device can thus be optimised for the particular application at hand.

BRIEF DESCRIPTION OF THE DRAWINGS

Examples of the present invention will now be described in detail with reference to the accompanying drawings, in which.

DETAILED DESCRIPTION

The present invention relates to device configurations which optimise light extraction or collection per unit surface area via improvement of efficiency of non radiative energy transfer, and thereby increase the number of exciton pairs actively involved in the light emission/collection process. Additional embodiments of the invention provide means to modify the shape of the far-field emission from a large area device without the need for lenses, and means to improve the emission rate.

First Embodiment of the Invention

The first embodiment of the present invention relates to an optical device including one or more energy transfer regions placed within an enclosing structure such that the composite structure supports an electronic band gap, and includes one or more arbitrarily shaped structures which penetrate one or more of the energy transfer regions, and including one or more light emitting/collecting particles disposed onto the internal side walls of the shaped structure such that the optically responsive particles are in close spatial proximity to the energy transfer region.

Figure 1:
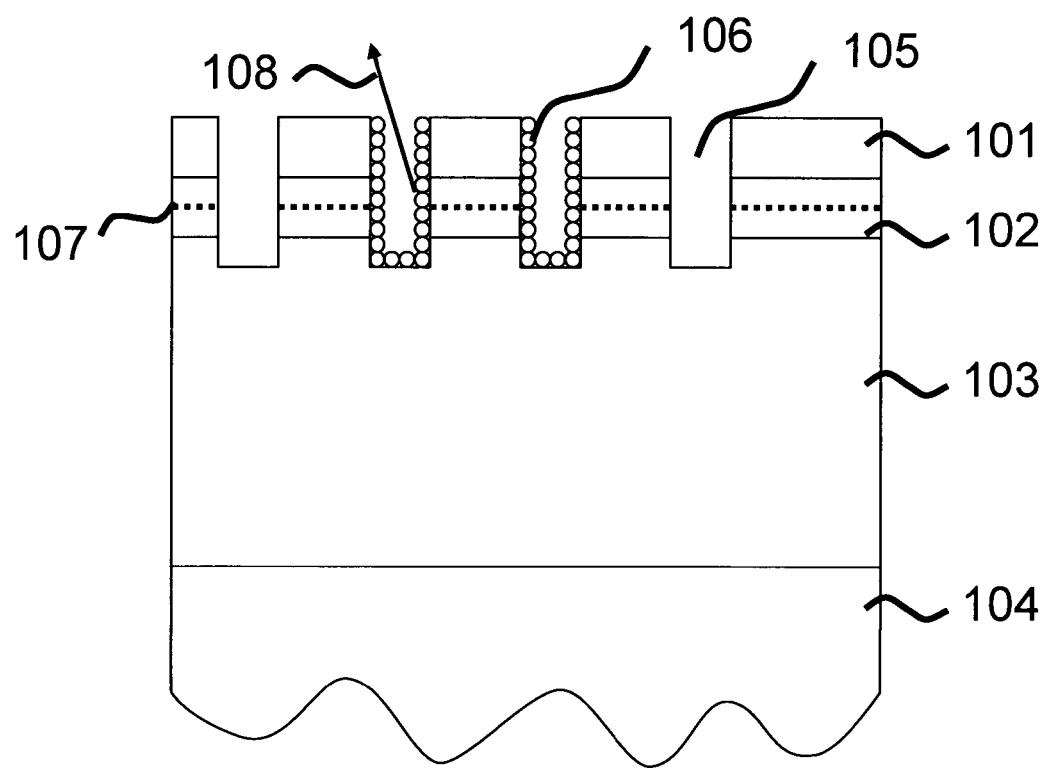
FIG. 1 shows a simplified depiction of the invention according to the first embodiment.

This arrangement allows participating nanoparticles to be placed within 10 nm of the Quantum well and provides improvement in efficiency of non-radiative energy transfer. The device structure has applications as a light emitting device, solar energy collection device, visual display, photodetector, Laser and single photon devices FIG. 1 shows a depiction of the invention according to embodiment 1 in detail. A substrate (104) supports the enclosing structure which takes the form of an epitaxial Heterostructure where 103 is an n-doped semiconductor material. 101 is a p-doped semiconductor material. Label 102 is a region incorporating at least one energy transfer region (107). 105 depicts a shaped structure etched through to the bottom of the energy transfer region (102). Label 106 depicts an optically responsive particle disposed onto the internal walls of the shaped structure. Label 108 represents a light ray emitted from 106. In addition electrical contacts (not shown) would be made to regions 101 and 103 such that an electrical current can pass through the entire enclosing structure and be conducted from or to an external circuit.

The enclosing structure may be a semiconductor heterostructure incorporating one or more quantum wells, in which case the quantum wells provide a high mobility energy transfer region. Alternatively, the structure may incorporate one or more p-n junctions with a depletion region in the vicinity of the interface, in which case the depletion layer provides the energy transfer region. Suitable materials for the enclosing structure include (but are not limited to) both direct band gap semiconductor materials (GaN, GaS, inP), indirect band gap materials (Silicon), as well as conductive polymers or organic materials. For clarity, although FIG. 1 depicts a structure with p-type material at the top and n-type material at the bottom, the device could equally well be configured with the p-type material in proximity to the substrate and n type material at the top, or indeed could be composed of multiple sets of p-n junctions supporting intermediate energy transfer regions. Preferably the energy transfer region provides a high mobility channel.

For operation as a Light Emitting device the composite enclosing structure would be configured such that its electronic band gap energy of would be larger than the inherent electronic band gap of the optically responsive particle. For operation as a Light Harvesting Device the composite enclosing structure would be configured such that its electronic band gap energy is smaller than the inherent electronic band gap of the optically responsive particle.

The enclosing structure is supported by a substrate (104) whose material properties are arbitrary to the operation of the device (provided that electrical contact is made to the lower material layer). The substrate may comprise (but are not limited to) Silicon, Silicon dioxide (glass), sapphire, polymer materials, copper, other metals, and may be flexible or rigid.

The optically responsive particles ideally support an electronic band gap, and are preferably selected from a group of direct band gap semiconductor materials with well defined shapes (Quantum dots, rods tetrapods etc) but may also be selected from a group of materials traditionally known as phosphors (usually also direct band gap semiconductor materials with irregular (amorphous) shape. Optically responsive particles may be encased in a supporting matrix material.

Preferably, the shaped structure provides a substantially enclosed environment for the optically responsive particles such that light initially emitted in a non beneficial direction (towards the substrate) becomes substantially redirected towards a beneficial direction.

Preferably, the depth of the structures is selected to maximise forward emission, but may penetrate down to (or even into) the substrate layer. Preferably the shaped structures are fabricated using a top-down approach (eg photolithography and subsequent chemical etching).

First Embodiment of a Light Emitter

We now discuss in detail the practical realisation and demonstration of the first embodiment of the present invention as a light emitting device with reference to the figures. From hereon the enclosing structure may be referred to as a 'Hetero-structure' An example device incorporates shaped structures comprising Elliptical cross-section holes etched into the surface of a conventional P-side up GaN LED epitaxy structure such that the shaped structures penetrate the active quantum well layers. Colloidal NQDs (acceptors) are brought to the close vicinity of the active layers (donors) by a simple drop cast method and the NQD absorption is tuned to strongly overlap with the LED emission thus satisfying the two main requirements for efficient nonradiative energy transfer. A control structure, with similar shaped structures etched to a shallower depth such that they do not penetrate any of the active quantum well layers was fabricated to allow comparison of colour conversion enhancement in the absence of nonradiative energy transfer. In practice a 2 fold enhancement of the NQD emission is observed in the former deep etched device, demonstrating the first embodiment of the invention.

Figure 2A:
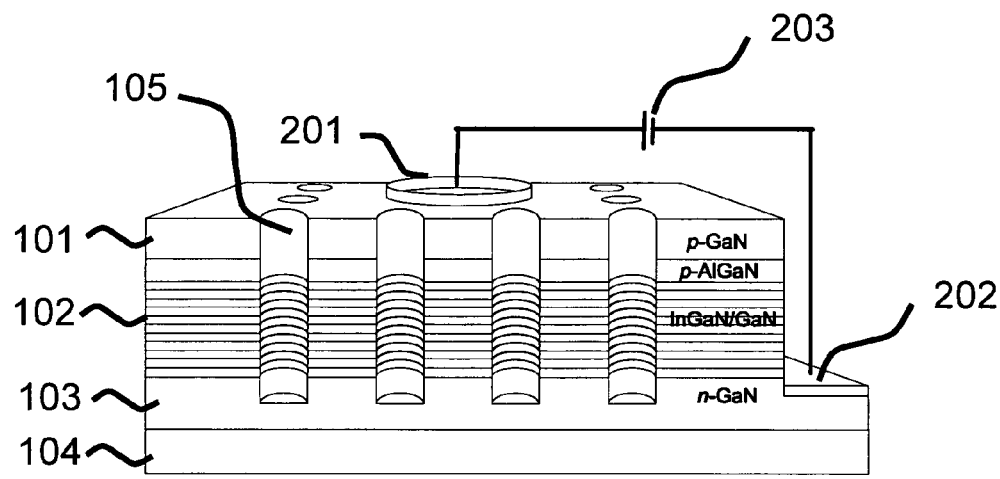
FIG. 2A shows a more detailed depiction of the invention according to the first embodiment for the specific example of a light emitting device.
Figure 2B:
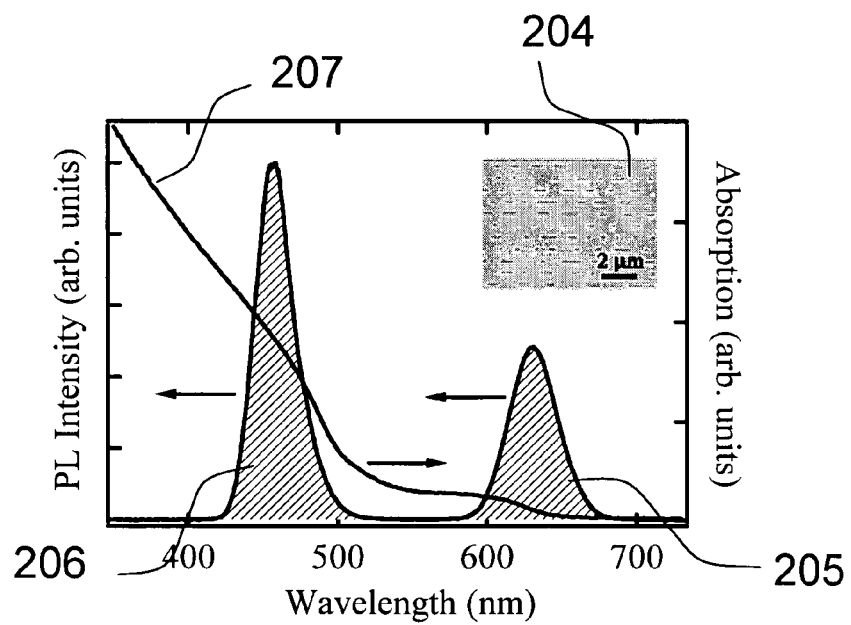
FIG. 2B shows the spectral overlap of the energy transfer region emission and the absorption and fluorescence spectrum of the optically responsive particles for a light emitting device.

A schematic diagram of the surface-textured LEDs used in this study is shown in FIG. 2A. A 2 µm thick undoped GaN buffer layer (103) is grown on a sapphire substrate (104) followed by a 2 µm thick n-doped GaN (103). The active layer (102) consists of 5 InGaN/GaN quantum wells and a 50 nm thick p-doped AlGaN layer grown on top. The device is terminated with a 0.2 µm thick p-doped GaN layer (101). As shown, 450 nm deep shaped structures (105) with elliptical cross-sectional shape are then etched through the top epitaxial layers such that they penetrate through multiple quantum wells (102). The p- and n-contacts are indicated by features 201 and 202. An external circuit and power source is indicated by 203. The insert to FIG. 2B (204) shows an scanning electron microscope (SEM) image of the LED surface. Highly efficient CdSe/CdS core/shell NQDs capped with hexadecylamine, tri-octylphosphine oxide (TOPO), and tri-n-octylphosphine (TOP) [R. H. Friend et al., Nature 397, 121 (1999)] were used as colour converters in this study. The absorption and fluorescence spectrum of the colloidal NQDs are illustrated in FIG. 2B which shows the spectral overlap of the QW emission (206) and the NQD absorption (207). NQD emission peak (205) is around 630 nm at room temperature. The photoluminescence peak of the LED is at 460 nm at room temperature.

Electroluminescence (EL) of the hybrid NQD/etched-QW LED devices, where the etched structure penetrate through the active layers, are measured perpendicular to the surface and compared to that of the control devices (non penetrated QWs). The EL intensity scales linearly with injection current and saturates at high injection current (not shown here). Linear increase of EL intensity is observed implying that injected carriers form excitons in the QWs. The etching process partly removes active layers and inevitably introduces surface states to the side walls of the textured structure. Consequently, the etched-QW LEDs emission is reduced in comparison to the control device for the same injection current.

Figure 3A:
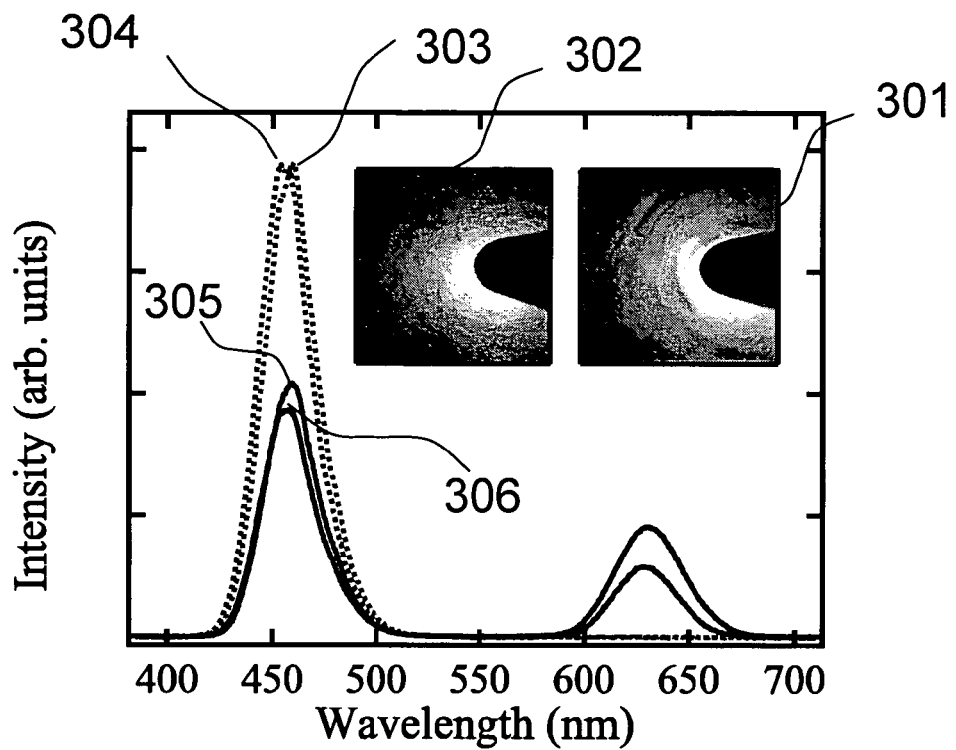
FIG. 3A compares emission properties of a light emitting device according to the first embodiment of the invention with and without optically responsive particles disposed on the side walls of the shaped structures for two different depths'
Figure 3B:
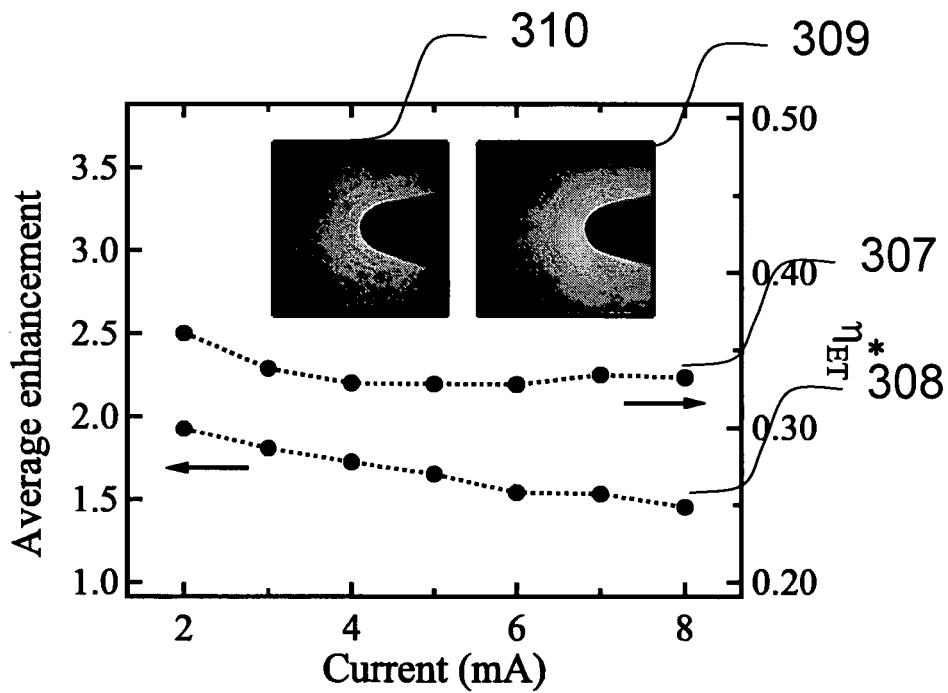
FIG. 3B shows non radiative energy transfer efficiency, and enhancement of light emission as a function of drive current for a light emitting device according to the first embodiment of the invention.

FIG. 3A shows the QW emission of the bare patterned LED with 0.15 µm (303) and 0.45 µm (304) hole depth at 3.8 mA and 7 mA, respectively. Label 305 (306) represents EL of the hybrid 0.15 µm (0.45 µm) LED. The inset 302 (301) show illumination of the hybrid 0.15 µm (0.45 µm) LED. In FIG. 3B, (308) shows nonradiative energy transfer efficiency at different current. Label (307) represents the enhancement of NQD emission. The inset 310 (309) panel shows illumination of the NQDs in hybrid 0.15 µm (0.45 µm) LED.

EL of the etched QWs at 7 mA (304) is comparable with that of the unetched QWs at 3.8 mA (303). The NQD emission pumped by the etched-QW LED is compared with NQD emission pumped by the unetched-QW LED to investigate the effect of nonradiative energy transfer on colour conversion efficiency. For the same EL of the bare QW emission (460 nm), NQD fluorescence pumped by etched-QW LEDs (306) is significantly higher than NQD emission pumped by unetched-QW LEDs (303). We propose that the enhancement of NQD emission is due to nonradiative energy transfer. Effective nonradiative energy transfer efficiency ($\eta^*_{ET}$) is estimated as follows:

$$\eta^*_{ET} = 1 - F_{DA}/F_D \tag{Eqn 1}$$

where $F_{DA}$ and $F_A$ are EL intensity of QW donors with and without NQD acceptors respectively. Here, $\eta^*_{ET}$ is averaged over the active area including both carriers that undergo nonradiative energy transfer and carriers do not. At low injection current, $\eta^*_{ET}$ decreases with increasing the injection current and remains constant for injection current above ~4 mA. It is conceivable that with increasing injection current heating and Coulomb screening leads to exciton dissociation into free electron-hole pairs, hence the decrease of $\eta^*_{ET}$.

FIG. 3B shows average enhancement of NQD emission, i.e. the ratio of NQD emission pumped by etched-QW LEDs to that pumped by unetched-QW LEDs. Evidently, the NQD fluorescence is enhanced through the whole range of injection currents and slightly decreases with increasing injection current. Insets of FIG. 3A show top-view image of the hybrid NQD/unetched QW LED (left panel) and of the hybrid NQD/etched QW LED (right panel). The corresponding images with a filter to cut the QW EL are shown in the inset of FIG. 3B.

Figure 4:
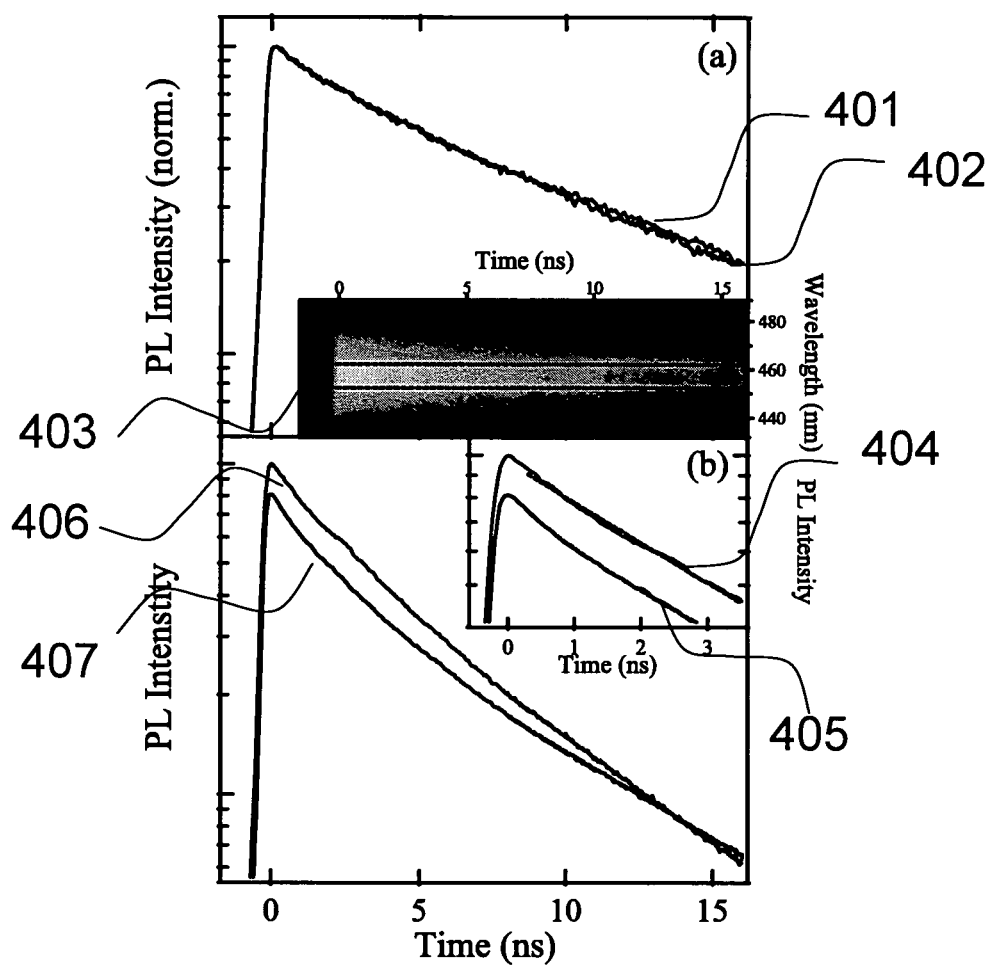
FIGS. 4(a)-(b) show comparisons of emission decay of a light emitting device according to the first embodiment of the invention with and without optically responsive particles disposed on the side walls of the shaped structures for two different depths of shaped structures.

To verify the existence of nonradiative energy transfer in the hybrid NQD/etched QW LED, the transient carrier dynamics in both the donor (QWs) and acceptor (NQDs) sites were investigated. The devices are excited at 400 nm with 100-fs pulse width and 250 kHz repetition rate. The photoluminescence is coupled into a streak camera with 300 ps resolution. FIG. 4 illustrates the time-resolved data of (a) unetched QWs and (b) etched QWs, respectively. FIG. 4(a) shows QW emission decay of 0.15 µm patterned LED without (401) and with (402) NQDs. Inset (403) shows the streak image of the bare 0.15 µm patterned LED used to extract the QW dynamics and the energy window. FIG. 4(b) shows QW emission decay of 0.45 µm patterned LED without (407) and with (406) NQDs. Dotted lines are fittings described in text.

The carrier dynamics of the unetched QWs with (402) and without (401) deposited NQDs are virtually identical. These results suggest that in the NQD/unetched-QW LED where donor-acceptor distance is large, i.e. 100 nm, nonradiative energy transfer does not occur. Hence, carriers in deposited NQDs are only generated from conventional radiative energy transfer. In contrast, carrier dynamics of etched QWs change after depositing NQDs as shown in FIG. 4(b). The QW photoluminescence with deposited NQDs decays faster at the first 4 ns and slower at later time compared to the bare QW. We interpret the faster decay as an effect of nonradiative energy transfer that introduce additional decay channel to carriers in the QW. The slower decay at later time is believed to be an effect of surface passivation of the etched QWs from the organic ligands of the deposited NQDs [T. Förster, Annalen der Physik 2, 55 (1948)]. Since not all electron-hole pairs in the QWs undergo nonradiative energy transfer, we categorise the electron-hole pairs into two groups, i.e. those that undergo energy transfer and those that do not. As nonradiative energy transfer rate decreases dramatically with increasing donor-acceptor distance, electron-hole pairs close to the air holes or NQDs (~10 nm distance) can undergo nonradiative energy transfer but the electron-hole pairs further away do not. The photoluminescence decay of the QW can be approximated with an exponential for the first 4 ns as shown in the inset 404 of FIG. 4(b). To extract the actual nonradiative energy transfer rate ($k_{ET}$) and the percentage of electron-hole pairs that undergo nonradiative energy transfer, we approximate and fit the photoluminescence decay of the NQD deposited on the QWs as follows:

$$I(t) = A \cdot e^{-k_{QW}t} + B \cdot e^{-(k_{QW}+k_{ET})t} \quad \text{(Eqn 2)}$$

where A and B are the fraction of electron-hole pairs that undergo and do not undergo nonradiative energy transfer respectively. $k_{QW}$ is total decay rate of the etched QWs taking into account the effect of surface passivation. From the fitting, 18% of generated electron-hole pairs experience nonradiative energy transfer with efficiency of 82% given by:

$$\left( \eta_{ET} = \frac{k_{ET}}{k_{ET} + k_{QW}} \right) \quad \text{(Eqn 3)}$$

The energy transfer efficiency is high because the donor-acceptor distance is limited only by the short ligand molecules on the surface of the NQDs, i.e. ~2 nm. In previous studies of planar heterointerfaces efficiencies as high as 65% were reported [M. Achermann et al., Nature 429, 642 (2004)] where a 2.5 nm thick capping layer was present to separate a single QW from NQDs. The absence of any barrier in this study allows for even higher nonradiative energy transfer efficiency to be observed.

SEM images of the sample, FIG. 2A, reveal that the holes perimeter with a 10 nm width corresponds only to 4% of the unetched area. Thus, under uniform excitation of our structure only ~6% of all the generated excitons in the active layer would undergo energy transfer in a static picture, which is only a third of the value we obtain from fitting the photoluminescence decay. However, exciton diffusion from regions further away from the holes towards the vicinity of the holes should increase the percentage of excitons undergoing nonradiative energy transfer. To investigate this possibility, we perform a 2-dimensional Monte Carlo simulation to calculate the percentage of excitons that undergo nonradiative energy transfer by taking into consideration exciton diffusion in the active layer of the etched QW LEDs. In our model, the motion of excitons in the active region is dominated by their thermal energy and their momentum scattering probability, for example scattering with impurities or phonons, is described by scattering time, $\tau_s$, while the probability of radiative and nonradiative decay is given by $k_{QW}$ and $k_{ET}$, which we obtained from time-resolved measurements. The momentum scattering time of carriers in InGaN QWs is estimated from the following equation:

$$\tau_s = m^* \mu / e, \quad \text{(Eqn 5)}$$

where m* is the effective mass, and μ is the carrier mobility. Although the carrier mobility in InGaN/GaN QWs varies largely in the literature for a momentum scattering time in the range of 1 ps to 10 ps we obtain that ~18% of excitons undergo nonradiative energy transfer. This result reassuringly agrees with the percentage we obtained from fitting the photoluminescence decay with equation 3.

Figure 5:
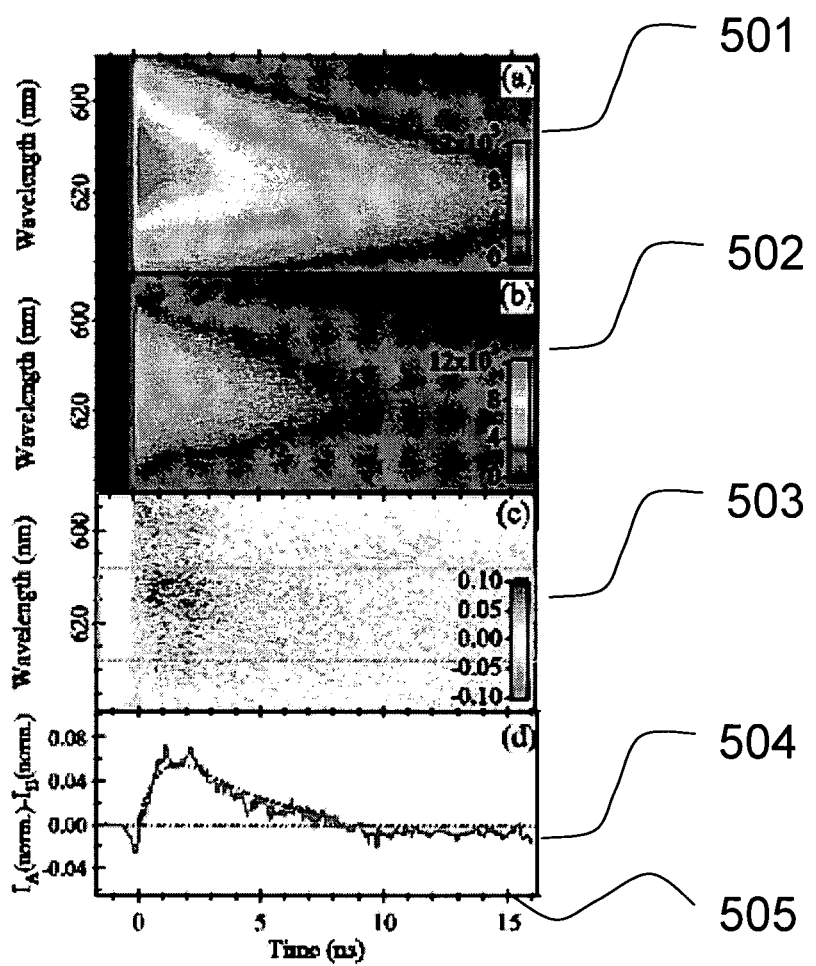
FIGS. 5(a)-(d) compare the dynamics of fluorescence decay of a light emitting device according to the first embodiment of the invention with and without optically responsive particles disposed on the side walls of the shaped structures for two different depths.

Still the observation of nonradiative energy transfer at the donor site does not provide conclusive evidence that the energy is transferred to the desired sites, the NQDs in our case. Thus, it remains imperative to prove the effect of nonradiative transfer on the transient NQD dynamics. FIG. 5 shows the fluorescence decay of NQDs deposited on (a) 0.45 μm (501) and (b) 0.15 μm (502) patterned LED. FIG. 5(c) (503) shows the difference of fluorescence dynamics calculated from normalised data of FIGS. 5(a) (501) and 5(b) (502). FIG. 5(d) (504) shows the average difference of fluorescence dynamics extracted from 20 nm energy window centered at the peak of NQD emission. Dotted line is the fitting described in text. FIGS. 5(a) (501) and 5(b) (502) show the fluorescence decay of NQD deposited on etched and unetched QW LEDs, respectively. It is apparent that the fluorescence of the former is higher due to non-radiative energy transfer.

To exclude any quantitative effect that may originate from the larger number of NQDs in the textured device we further investigate the effect of nonradiative energy transfer on the NQD fluorescence decay. The normalised data of FIG. 5(a) is subtracted by that of the normalised data of FIG. 5(b). FIG. 5(c) show that the energy transfer creates additional carriers in the deposited NQDs at early time as shown by the blue area (positive counts). A 20-nm window centered at the NQD fluorescence peak, as depicted with dashed lines in FIG. 5(c), is used to extract the average carrier dynamic of the deposited NQDs shown in FIG. 5(d). From S. Blumstengel et al., Phys. Rev. Lett. 97, 237401 (2006), the carrier dynamic of the deposited NQDs including nonradiative energy transfer from the QWs can be described by:

$$I(t) \propto \frac{k_{ET}}{k_{NC} - k_{QW} - k_{ET}} \left( e^{-(k_{QW}+k_{ET})t} - e^{-k_{NC}t} \right) \quad \text{(Eqn 6)}$$

where $k_{NC}$ is the NQD fluorescence decay rate. By using the parameters obtained form the measurement of the time-resolved QW dynamics, the fitted carrier dynamic due to energy transfer from the QWs to the NQDs, as shown by a dotted line in FIG. 5(d), is in good agreement with the experiment (solid red line), unequivocally demonstrating non-radiative energy transfer from the QW-LED to the NQDs.

First Embodiment of a Light Harvesting Device Incorporating Quantum Wells

For purpose of example we now discuss in detail experiments demonstrating the first embodiment of the present invention in practice as a light harvesting device with reference to the figures. In this example the composite enclosing structure incorporates Quantum Wells as the energy transfer region.

Figure 6A:
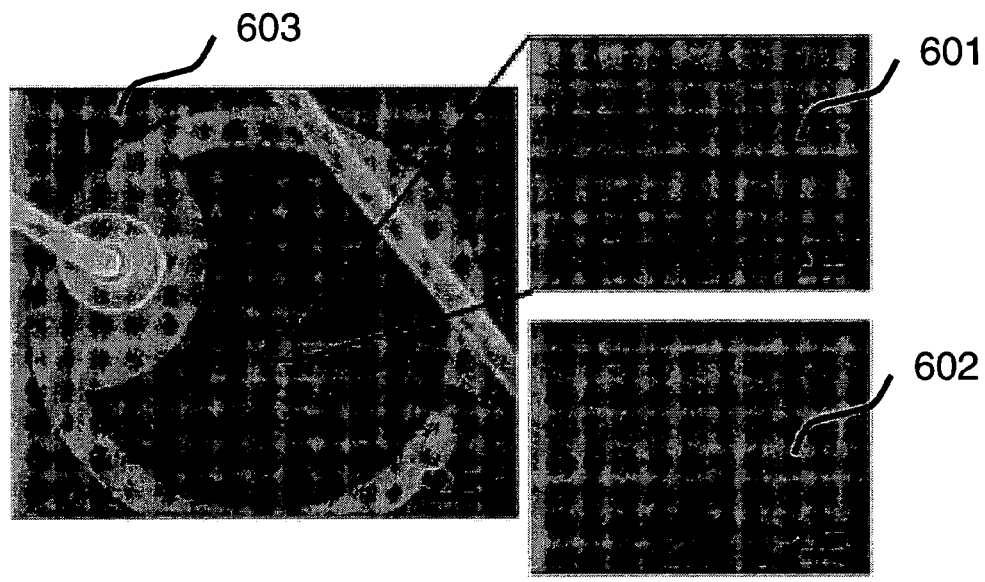
FIG. 6A shows scanning electron micrographs of an example of a light harvesting device according to the first embodiment of the invention.
Figure 6B:
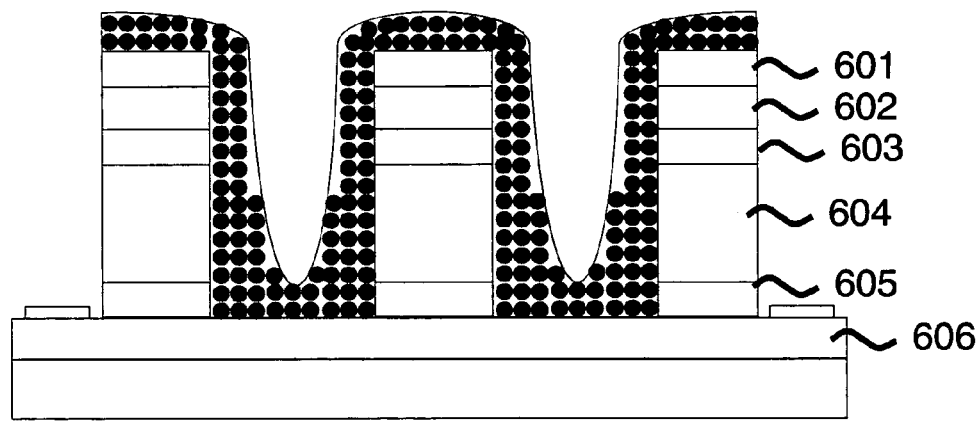
FIG. 6B shows a cross-sectional schematic of an example of a light harvesting device according to the first embodiment of the invention where the shaped structures are partially filled with optically responsive particle.
Figure 6C:
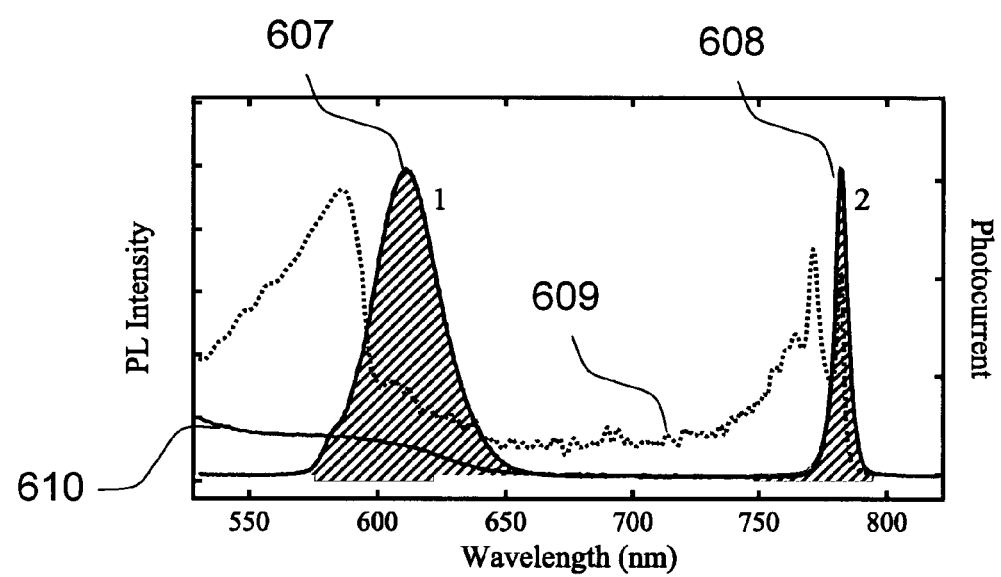
FIG. 6C compares spectral overlap between optically responsive particles and the energy transfer region, and displays fluorescence and absorption spectrum of the optically responsive particles, and heavy and light hole resonance conditions.

An example heterostructure was grown by molecular beam epitaxy on a (100) GaAs substrate in a p-i-n configuration consisting of 20 periods of 7.5 nm thick GaAs quantum wells with 12 nm thick AlGaAs barriers. An open circular mesa forms the top contact of the structure. A scanning electron microscope image of the patterned p-i-n sample is shown in FIG. 6A. The top (601) and bottom right (602) SEM images are a magnification of the channels before and after the deposition of NQDs. FIG. 6B shows a schematic of the hybrid patterned device where the channels are partially filled with NQDs with features as follows: 601 p+GaAs, 602 p+AlGaAs, 603 i-AlGaAs, 604 i-MQW, 605 i-AlGaAs. 606 n-GaAs. FIG. 6C shows the spectral overlap of the hybrid NQD/patterned p-i-n structure, the NQD fluorescence (607), and the absorption (blue line) spectrum. The photoluminescence of the quantum wells (608) and the photocurrent of the p-i-n device (609) that shows the heavy- and light-hole resonance.

Heavy and light hole absorption peaks are observed from photocurrent measurements and are shown together with the quantum well photoluminescence in FIG. 6C at 25 K. Photocurrent measurements also reveal strong absorption from the topmost AlGaAs barriers around 585 nm. In this example shaped structures take the form of channels etched into the surface of the Heterostructure using a focused $Ga^+$ ion beam, in a pattern of 80×80 $\mu m^2$ 1.4 $\mu m$ deep, 570 nm wide and separated by 1.5 $\mu m$ wide wires (inset of FIG. 6A). The hybrid LED is completed by drop casting an overlayer of colloidal NQDs on the patterned p-i-n structure. For reference purpose colloidal NQDs are also deposited onto a flat (non patterned) p-i-n structure which serves as a control sample thereby allowing measurement of photocurrent enhancement due to nonradiative energy transfer.

To minimise the effect of radiative energy transfer to the quantum wells from the quantum dots deposited on the top surface of the structure (the intention being to measure improvement due solely to introduction of shaped structures through the Quantum wells) we use CdSe/CdS colloidal NQDs with strongly detuned emission energy from the heavy and light-hole absorption peaks of the quantum wells. The NQDs are grown using organometalic synthesis and are capped with hexadecylamine, tri-n-octylphosphine oxide, and tri-n-octylphosphine. The fluorescence and absorption spectrum of the NQDs is shown in FIG. 6C and a schematic of the hybrid NQD/patterned p-i-n structure is shown in FIG. 6B, where the channels are sketched only partially filled with NQDs as observed from scanning electron microscopy of the hybrid structures, which is shown in the bottom right image of FIG. 6A.

Micro-structuring of the p-i-n device exposes the lateral side of the embedded quantum wells leading to formation of surface states that are known to trap quantum well carriers (these are highly detrimental to conventional LEDs). The influence of nonradiative surface states on the quantum yield of the emission is accentuated in colloidal NQDs where the number of surface to bulk atoms in the crystal is increased. In the case of colloidal NQDs recent advances in synthetic chemistry allowed for passivation of the surface dangling bonds with appropriate organic ligands. Recently, colloidal NQDs with quantum yields approaching 100% were reported by X. Brookman in Physical Review Letters 93, 107403 (2004). Here we minimise the detrimental effect of surface states on the revealed quantum well facets by depositing colloidal NQDs with organic ligands that also passivate the surface states of the microstructured quantum wells. Although the nature of the passivations is not fully understood, the elimination of nonradiative surface states is confirmed from transient quantum well photoluminescence measurements.

Figure 7A:
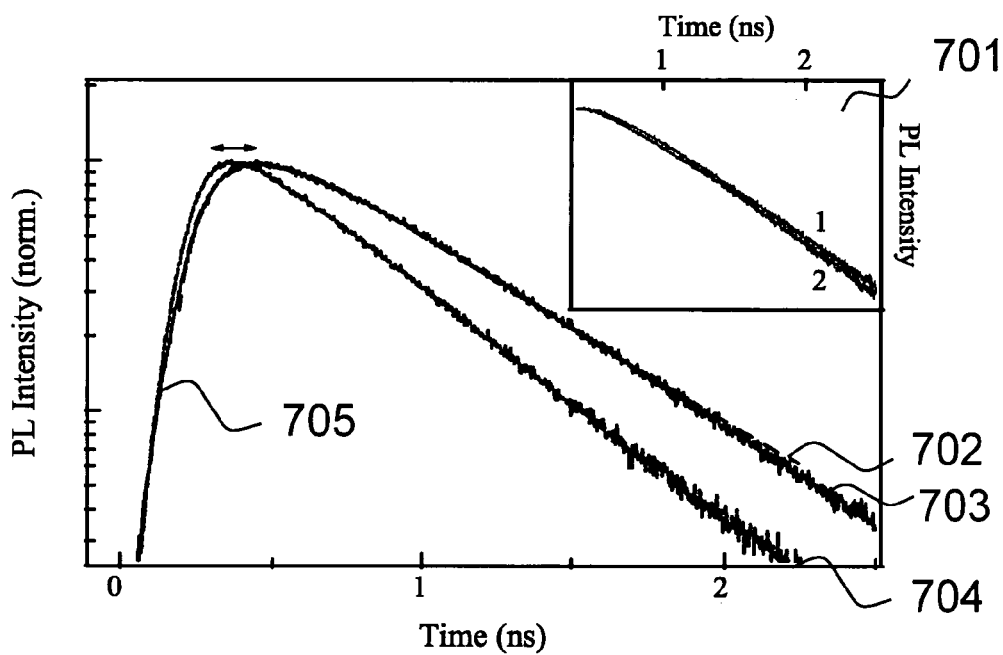
FIG. 7A compares time resolved photoluminescence decay of the energy transfer region with and without the presence of optically responsive particles for an example of a light harvesting device according to the first embodiment of the invention.
Figure 7B:
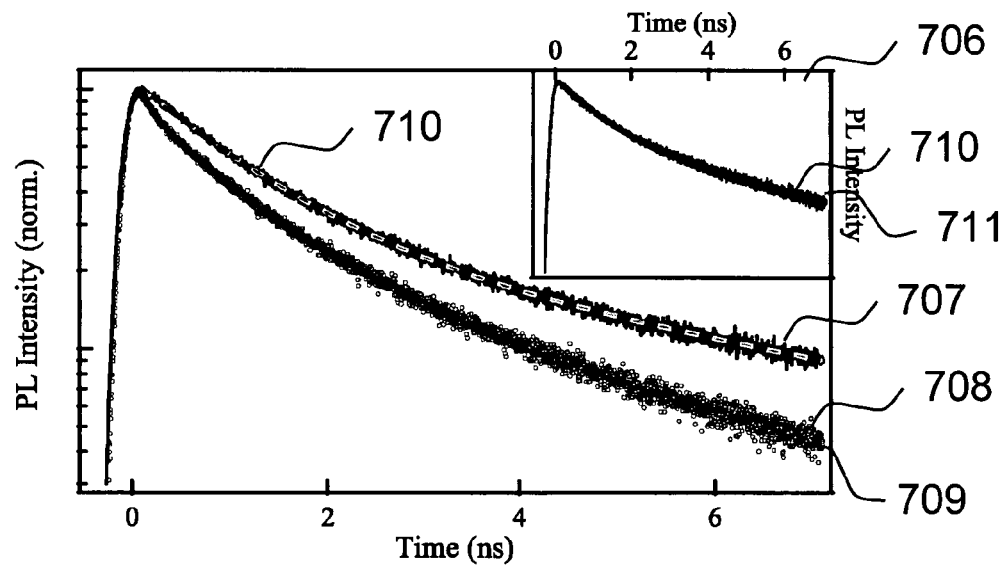
FIG. 7B compares fluorescence decay of light absorbing particles on a glass substrate and the patterned heterostructure relevant to an example of a light harvesting device according to the first embodiment of the invention.

The quantum well photoluminescence decay of the patterned p-i-n structures with and without the colloidal NQDs is shown in FIG. 7A. The time resolved measurements of the hybrid NQD/patterned p-i-n structure are measured at 25K. FIG. 7A shows the photoluminescence decay of the bare patterned p-i-n device before (704) and after (703) depositing NQDs. The double arrows point to the extended rise time in the hybrid patterned structure due to nonradiative energy transfer. Curve 702 is the fitting result of Equation (1). Inset (701) of FIG. 7A shows the photoluminescence decay of the hybrid NQD/patterned p-i-n structure (decay 1) and the photoluminescence decay of the flat p-i-n structure (decay 2). FIG. 7B shows the fluorescence decay of NQDs on a glass substrate (solid line 707) and on the patterned p-i-n structure (open circles 709). The red dashed (710) and the dotted lines (708) are the bi-exponential fitting curves of the NQD fluorescence on a glass substrate and on the patterned p-i-n structure respectively. Inset (706) of FIG. 7B shows the fluorescence decay of the NQDs on a glass substrate (710) and on the unpatterned p-i-n device (711).

The patterned p-i-n structures are excited non-resonantly at 584 nm and the photoluminescence dynamics are recorded using time-correlated single-photon counting and an avalanche photodiode that provides 40 ps resolution, while spectral filters are used to select the photoluminescence of the quantum wells only. The long tail of the photoluminescence decay (t≥1 ns) is fitted with an exponential curve and the decay rate is estimated for both structures. The photoluminescence decay rate of the bare patterned structure is 20% faster compared to the decay rate of the hybrid patterned structure ($k_{QW}$=2.13 $ns^{-1}$, $k_{QW+QD}$=1.78 $ns^{-1}$) signifying the contribution of organic ligands on the surface of the colloidal NQDs in passivating the surface states of the patterned quantum wells. We have observed (not shown here) that not all kinds of surface ligands will reduce the non-radiative recombination rate of the patterned quantum well surface states and that some kinds (amines) will even increase the recombination rates. Remarkably a comparison of the long tail of the photoluminescence decay of the hybrid patterned p-i-n structure and of the flat (control) sample, also plotted in 701, shows very similar transient decay curves (decay rates within 1% for t≥1 ns) suggesting that organic ligands can virtually eliminate any additional nonradiative recombination sites that occur from the patterning of the p-i-n structure.

The extended rise time of the hybrid patterned quantum wells compared to the bare patterned quantum wells indicated with a double arrow in FIG. 7A shows the onset of energy transfer from colloidal NQDs to the quantum wells. Colloidal NQDs deposited in the channels of the patterned quantum wells transfer energy in the adjacent structure both radiatively and nonradiatively. To characterise the efficiency of nonradiative energy transfer in the hybrid NQD/patterned p-i-n structure the fluorescence decay of colloidal NQDs in the hybrid structure and on a glass substrate is measured using time-correlated single photon counting and appropriate spectral filters. The NQDs are non-resonantly pumped at 400 nm, 200-fs pulses, 250 kHz repetition rate. FIG. 7B shows the fluorescence decay of NQDs on a glass substrate and on the patterned p-i-n structure and comparison of the two fluorescence decay curves clearly reveals the presence of an extra nonradiative energy transfer channel in the hybrid structure.

Whereas on the glass substrate the fluorescence decay of NQDs is dominated by the radiative and any nonradiative recombination channels intrinsic to the NQDs, in the hybrid patterned structure nonradiative energy transfer to the patterned quantum wells contributes to the NQD fluorescence decay rate as an extra nonradiative channel. Thus, the fluorescence decay rate of the NQDs in the hybrid structure is given by the following:

$$k_H = k_{QD} + k_{ET} \quad \text{(Eqn 7)}$$

where $k_{QD}$ and $k_{ET}$ are fluorescence decay rate of the NQDs and nonradiative energy transfer rate respectively. Since nonradiative energy transfer strongly scales with the separation distance between donor and acceptor, in the hybrid configuration only the NQDs deposited on the sides of the channels of the patterned structure transfer energy nonradiatively and therefore we can assume that there are two kinds of NQDs in the ensemble, those that undergo nonradiative energy transfer and those that do not.

The fluorescence decay of NQDs on a glass substrate, shown in FIG. 7B, is dominated by a fast and a slow component that can be approximated with a bi-exponential fit also plotted in FIG. 7B, with the fast decay rate $k_{QD_1}$=0.9 ns$^{-1}$ and the slow decay rate $k_{QD_2}$=0.2 ns$^{-1}$. The inset (706) of FIG. 7B shows the fluorescence decays of the NQDs on an unpatterned p-i-n structure and on a glass substrate. The decay dynamics in both cases are virtually identical, which also suggest that inter-dot dynamics are unchanged on the glass substrate and the unpatterned p-i-n structures. The fluorescence decay of NQDs on the patterned structure can be more accurately described by:

$$I(t) = \sum_{i=1,2} A_i \cdot e^{-k_{Hi}t} + \sum_{i=1,2} B_i \cdot e^{-k_{QDi}t} \quad \text{(Eqn 8)}$$

The first two terms describe the decay dynamics of the NQDs that transfer energy to the patterned structure nonradiatively and the last two terms describe the decay dynamics of the NQDs that do not transfer energy to the patterned structure nonradiatively. Since the energy transfer rate is proportional to the oscillator strength of the donor dipole, the ratio of the energy transfer rates corresponding to the transition dipoles of high and low oscillator strength scales approximately with the ratio of the fluorescence decay rates of the fast and slow components, respectively, as follows:

$$\frac{k_{QD_1}}{k_{QD_2}} = \frac{k_{ET_1}}{k_{ET_2}}. \quad \text{(Eqn 9)}$$

This dependence also indicates that the contribution of the fast and slow components to the transient fluorescence, with and without nonradiative energy transfer, should remain unchanged. By taking these considerations into account we fit the fluorescence decay curve of the NQDs in the hybrid configuration, shown in FIG. 7B, and obtain that the nonradiative energy transfer efficiency ($\eta_{ET}$) in the hybrid patterned configuration is 79%, where $$\eta_{ET} = k_{ET}/(k_{ET} + k_{QD}) \quad \text{(Eqn 10)}$$

From the relative amplitude of the two subsets of NQDs it emerges that ~81% of the NQDs undergo nonradiative energy transfer, which suggests that only a thin layer of NQDs are deposited on the patterned structure. The full potential of this hybrid configuration can be gauged by comparison of the photocurrent of the hybrid patterned and hybrid flat heterostructure. Both samples are optically excited at 400 nm, 200 fs pulses, 250 kHz repetition rate, focused at a spot size smaller than the etched area of the patterned p-i-n structure, typically ~40 μm, and the generated photocurrent is measured using lock-in detection and the excitation wavelength is chosen so as to avoid non-linear absorption of NQDs.

Figure 8:
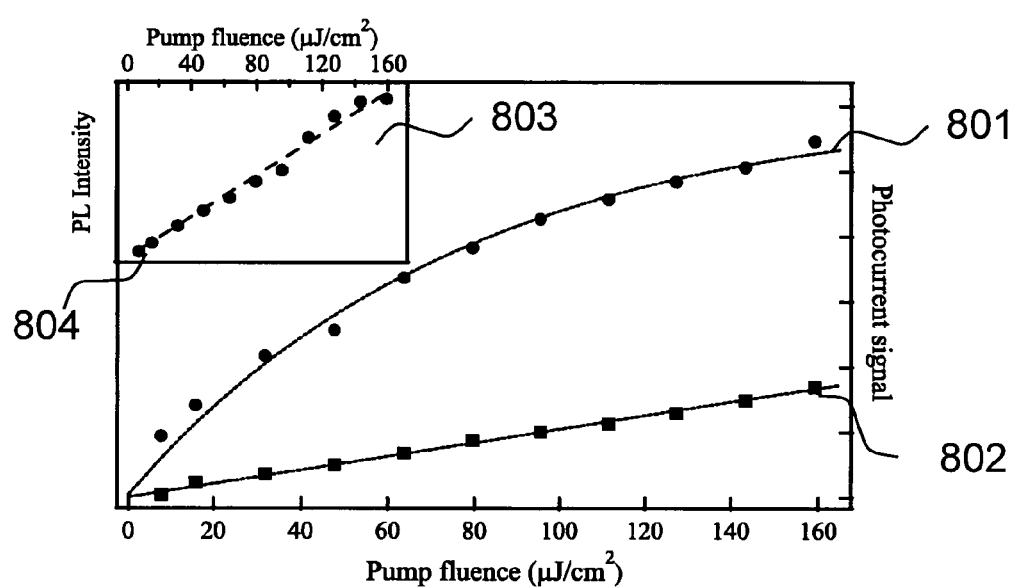
FIG. 8 shows the Photocurrent of an example of a light harvesting device according to the first embodiment of the invention, and compares pump fluence dependence of photocurrent with and without the introduction of shaped structures protruding through the energy transfer region. The inset shows fluorescence intensity versus excitation intensity.

FIG. 8 shows the Photocurrent of hybrid NQD/p-i-n structure. Pump fluence dependence of photocurrent of the hybrid NQD/flat quantum well structure (squares) and of the hybrid NQD/patterned patterned p-i-n structure (dots) at 25 K. Solid lines (801) and 802 are fits to the photocurrent signal as described in the text. Inset (803): fluorescence intensity of NQDs (dashed line) versus excitation intensity (dots 804). Comparison of photocurrent measurements on the hybrid flat (control) device and on the hybrid patterned p-i-n structure, shown in FIG. 8, demonstrate a dramatic increase in the hybrid patterned device.

In the flat (control) structure NQD fluorescence is absorbed at the topmost layer of the p-i-n device and the measured photocurrent is virtually unaffected by the overlayer of colloidal NQDs due to the short absorption length (~250 nm) of the top layers of the device. This is due to the bending of the conduction band at the vicinity of the electrical contact that prevents the separation of the optically excited electron hole pairs at the top layer and therefore the generation of photocurrent, also observed from the wavelength dependence of the photocurrent shown in FIG. 6C. In stark contrast, deposition of colloidal NQDs on the patterned structure dramatically increases the measured photocurrent, where lateral energy transfer can occur through the whole cross-section of the micro-channels. The photocurrent (I) of the control sample exhibits a linear dependence on the pump fluence $$(P), I \propto a_C \cdot P \quad \text{(Eqn 11)}$$

where $a_c$ is power conversion constant. In the case of the hybrid patterned structure we observe a tendency towards saturation for pump fluence higher than 60 μJ/cm$^2$. It is possible that the photocurrent saturation in the hybrid patterned heterostructure is observed due to non-linearities in the quantum wells such as excitation induced changes of the refractive index and non-linear absorption [D. S. Chemla et al., IEEE J. Quantum Electron. 20, 265 (1984). T. Sizer et al., IEEE J. Quantum Electron. 30, 399 (1994)]. We approximate the photocurrent of the hybrid patterned structure as follows:

$$I = I_S(1 - e^{-a_H \cdot P}) \quad \text{(Eqn 12)}$$

where $I_S$ and $a_H^{-1}$=76.9 μJ/cm$^2$ are the saturation photocurrent and threshold power, respectively. For pump fluence in the range of linear response of the hybrid structure the ratio of the photocurrent conversion efficiency of the two devices is given by the following equation:

$$(I_S \cdot a_H)/a_C = 6 \quad \text{(Eqn 13)}$$

Clearly lateral energy transfer in the patterned configuration is improving the light to current conversion efficiency. We have confirmed that the photocurrent saturation is not due to non-linearities on the NQD emission [R. M. Kraus et al., J. Phys. Chem. B 109, 18214 (2005)] since we observe a linear increase of the integrated NQD fluorescence for the same range of pump fluence, shown in the inset of FIG. 8, and that the photocurrent of the hybrid flat and the bare flat p-i-n structure is virtually identical within the absorption spectrum of the NQDs. From the ratio of the nonradiative energy transfer rate to the NQD radiative rate we can estimate the contribution of the two processes in the increase of the measured photocurrent. The NQD radiative rate is given by the following equation:

$$k_{rad} = k_{QD} \cdot Q_{ef} \quad \text{(Eqn 14)}$$

where $Q_{ef}$ is the quantum efficiency of the NQDs. For the NQDs used in this study, $Q_{ef}\cong 40\%$. From the transient fluorescence measurements we derive the following:

$$\frac{k_{ET}}{k_{QD}\cdot Q_{ef}}\cong 10 \quad \text{(Eqn 15)}$$

which strongly suggests that the NQDs pump the p-i-n structure mostly through nonradiative energy transfer. To quantitatively describe the nonradiative energy transfer we use a kinetic model that can describe excitation dynamics in hybrid heterostructures. For cold optical pumping of the NQDs the analytic solution of the hybrid NQD donor-QW acceptor system is given by the following expression:

$$I(t)=\sum_{i=1,2}\frac{n_{QDi}(0)k_{ETi}}{k_{QW}-k_{QDi}-k_{ETi}}\left(e^{-(k_{QDi}+k_{ETi})t}-e^{-k_{QW}t}\right)+f(t) \quad \text{(Eqn 16)}$$

where $\eta_{QD_1}(0)$ is the initial population of the resonantly excited NQDs, $k_{QW}=2.1$ ns$^{-1}$ is photoluminescence decay rate of the quantum wells and f(t) is the direct optical pumping. This equation accurately describes the photoluminescence decay of the quantum wells. In FIG. 7A, the photoluminescence decay of the quantum wells is superimposed with a fit of the above equation, where the only variable parameters are the initial populations $\eta_{QD_1}(0)$ and ratio between direct optical pumping and indirect energy transfer from the NQDs. The best fit is obtained when 89% of the energy is injected into the QWs through nonradiative energy transfer from the NQDs in agreement with the qualitative estimation derived above for the ratio of the nonradiative energy transfer rate to the NQD radiative rate.

The presented hybrid p-i-n structure exemplifies the strength of nonradiative energy transfer in appropriately engineered hybrid photovoltaic devices for channeling energy between intrinsically different classes of semiconductors, while overcoming altogether the limitations imposed by the low charge transfer efficiency of highly absorbing compounds. Conclusive evidence of the transfer mechanism is produced by complimentary measurements of the transient dynamics of the NQDs and the p-i-n structure. For this purpose, the characterisation of the effect is studied at low temperatures in order to allow for sufficient photoluminescence quantum yield of the p-i-n device. The observed light to current conversion efficiency enhancement depends on temperature only through the scaling of the transfer mechanism between bound and free carrier pairs. Therefore, the introduced hybrid configuration provides a new route for room temperature highly efficient photovoltaic devices. Control over the growth of NQDs and understanding of the dynamics of nonradiative energy transfer between QWs and NQDs or organic compounds has reached maturity in order for the investigated configuration to demonstrate photocurrent enhancement compared to the bare p-i-n or pn devices. Furthermore, this configuration is not limited to NQDs but it is applicable to any solution based highly absorbing semiconductor materials.

First Embodiment of a Light Harvesting Device Incorporating a p-n Junction

For purpose of example we now discuss in detail the practical implementation and demonstration of the first embodiment of the present invention as a light harvesting device with reference to the figures whereby the composite enclosing structure incorporates a single p-i-n junction as the energy transfer region in a configuration, leading to strong enhancement of the measured photocurrent. The excited state energy of the deposited NCs is efficiently transferred to a patterned bulk heterostructure by means of nonradiative energy transfer. Electron-hole pairs transferred to the heterostructure are subsequently separated by the built-in electric field and are collected by the electrodes resulting in electrical current.

Figure 9A:
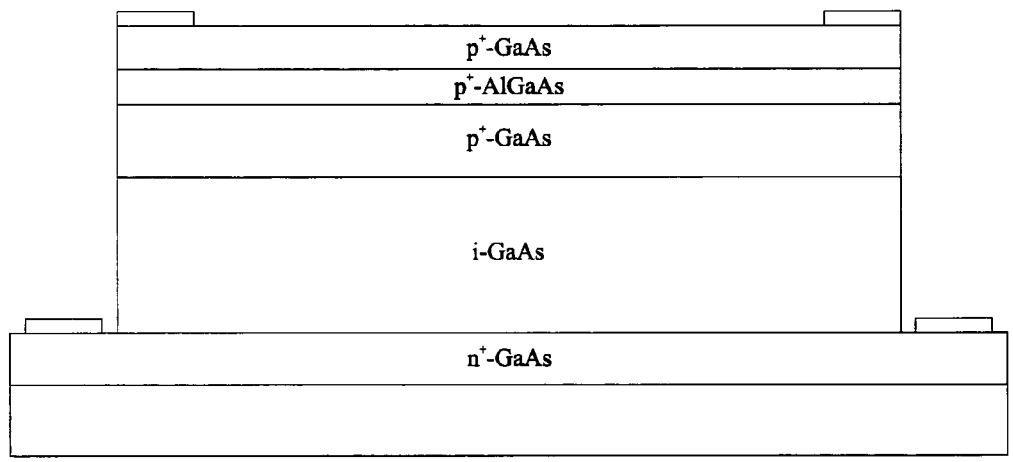
FIG. 9A shows a cross sectional schematic diagram of an example of a light harvesting device according to the first embodiment of the invention whereby the energy transfer region is a single p-i-n junction.
Figure 9B:
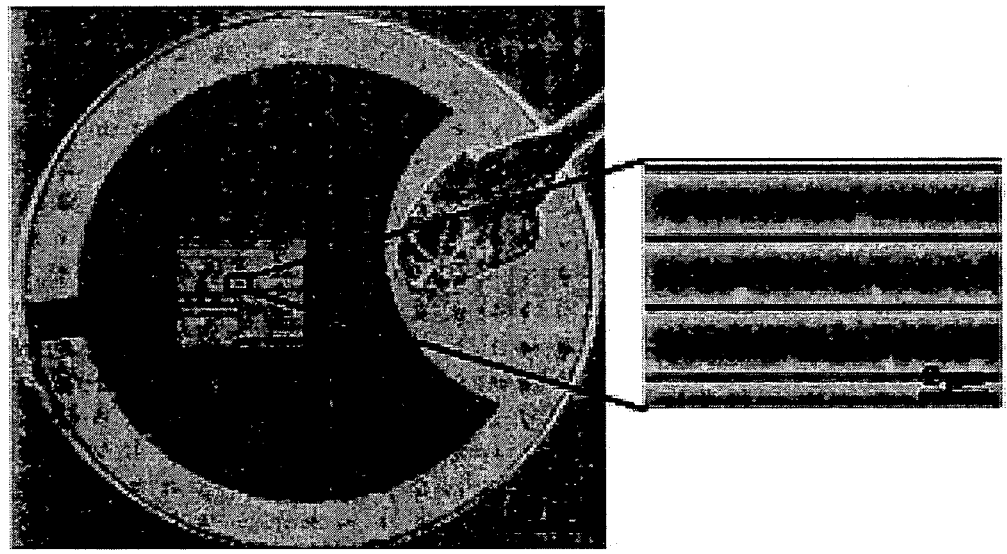
FIG. 9B shows scanning electron microscope (SEM) images of the corresponding patterned heterostructure.

The semiconductor bulk heterostructure used in this example offers higher carrier transport than the QW heterostructure in the previous example. In this configuration, wide absorption range and high oscillator strength of colloidal NCs are utilised while low carrier transport is overcome. Efficient carrier extraction from colloidal NCs by this hybrid configuration releases potential of high efficiency photovoltaic cells and optoelectronic devices. The example semiconductor heterostructure was grown by molecular beam epitaxy (MBE) on a (100) GaAs substrate as shown in FIG. 9A. The undoped GaAs layer is 760 nm below the surface. FIG. 9B shows scanning electron microscope (SEM) images of the patterned heterostructure. The Inset shows the magnified image of the channels. A 2.3 µm thick layer of n-doped GaAs was grown on the substrate followed by a 1 µm thick undoped-GaAs layer and a successive 500 nm thick p-doped GaAs layer. A 43 nm thick layer of p-doped $Al_{0.4}Ga_{0.6}As$ was subsequently grown before the top layer of 220 nm thick p-doped GaAs. The heterostructures were fabricated in circular mesas of 400 µm diameter with the top metal contact attached to the p-doped GaAs layer and the second contact attached to the n-doped GaAs layer.

Figure 10:
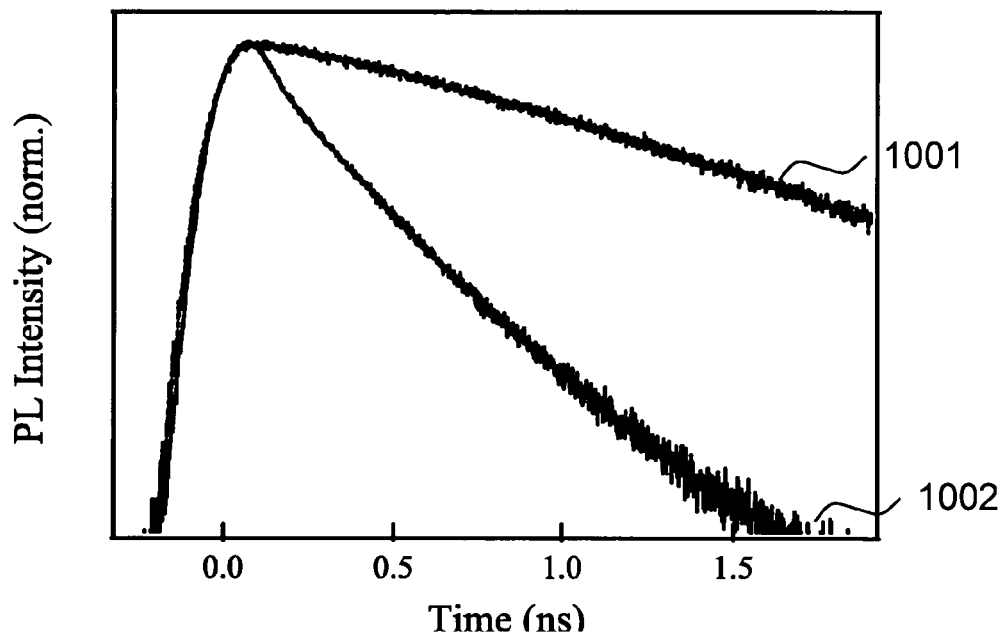
FIG. 10 shows the Photoluminescence decay characteristic for unpatterned and patterned heterostructures relevent to an example of a light harvesting device according to the first embodiment of the invention, where the energy transfer region is a single p-i-n junction.

FIG. 9B illustrates scanning electron microscope (SEM) images of the patterned heterostructure. Channels of 300 nm wide and 1.8 µm deep separated by 1.9 µm width are fabricated on the p-i-n heterostructures by a focused Ga$^+$ ion beam (FIB). In the patterning process, the active layer of the heterostructure is partly removed to fabricate the channels and surface states are inevitably introduced to the heterostructures. The surface states serve as recombination centres or carrier traps that lead to the decrease of photocurrent in the patterned heterostructures. FIG. 10 shows photoluminescence decay of the heterostructure before (1001) and after (1002) FIB patterning at 25 K. Decay time for the heterostructure decreases from 1 ns in the unpatterned structure to 250 ps in the patterned structure demonstrating the occurrence of surface states in the unpatterned structure. Consequently, the photocurrent of the heterostructure decreases ~84% after the channel patterning, i.e. $I_{pattern}=1$ µA, $I_{flat}=6.7$ µA when the heterostructures were excited at 570 nm.

Water soluble CdTe NCs capped by mercaptopropionic acid (MPA) were prepared by aqueous synthesis method. The absorption and fluorescence of the NCs at room temperature are shown in FIG. 10. The NCs were deposited on the patterned heterostructure by drop casting to form the hybrid patterned device. The NCs were also deposited on unpatterned heterostructures to use as the control systems. Photocurrent of the two devices was measured in order to observe the effects of nonradiative energy transfer in the hybrid patterned structure. Since energy transfer rate ($k_{ET}$) is inversely proportional to donor-acceptor separation distance (r), for instance, $k_{ET} \propto r^{-6}$ in point-like isolated dipoles [Chen, H. S.; Wang, S. J. J.; Lo, C. J.; Chi, J. Y. *Applied Physics Letters* 2005, 86, (13)] energy transfer rate decreases rapidly as the donor-acceptor separation distance increases. Therefore, carrier generation associated with nonradiative energy transfer takes place only within few nanometers from the top surface. Moreover, at 220 nm below the top surface there is a 43 nm thick layer of AlGaAs that hinders electrons generated in the topmost layer to transport to the cathode. Hence, there would be no effect of nonradiative energy transfer on photocurrent of the control structure.

Figure 11:
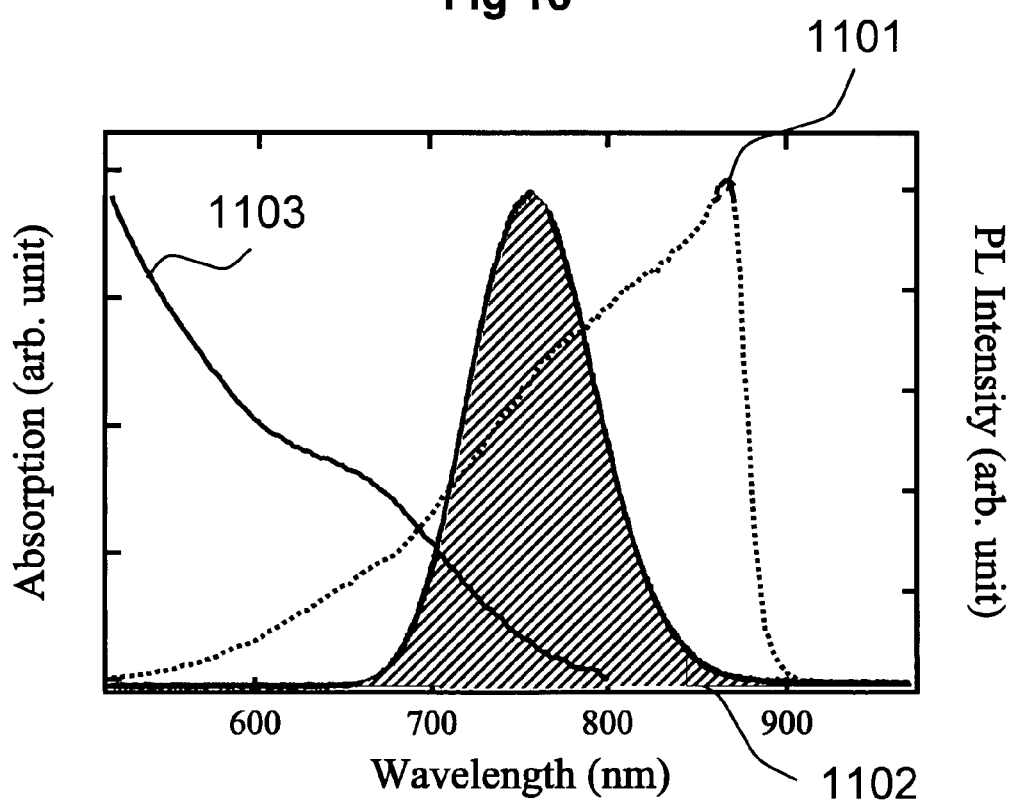
FIG. 11 compares the absorption and fluorescence spectrum of the optically responsive particles, and also shows photocurrent of an example of a light harvesting device according to the first embodiment of the invention, where the energy transfer region is a single p-i-n junction.

Another factor playing an important role in nonradiative energy transfer rate is spectral overlap (Θ) between donor emission and acceptor absorption, i.e. $k_{ET}$ scales linearly with Θ. FIG. 11 shows the overlap between the NC emission and the photocurrent of the heterostructures. Absorption (1103) and fluorescence spectrum (1102) of the NCs. Photocurrent of the heterostructure (1101) shows spectral overlap of NC donors and undoped-GaAs acceptors.

Back energy transfer from the heterostructure to the NCs is not allowed considering the emission of the heterostructure and the absorption of the NCs. Furthermore, charge transport from CdTe NCs to GaAs based heterostructures cannot happen because of the energy band offset of the NCs and the heterostructures.

Figure 12:
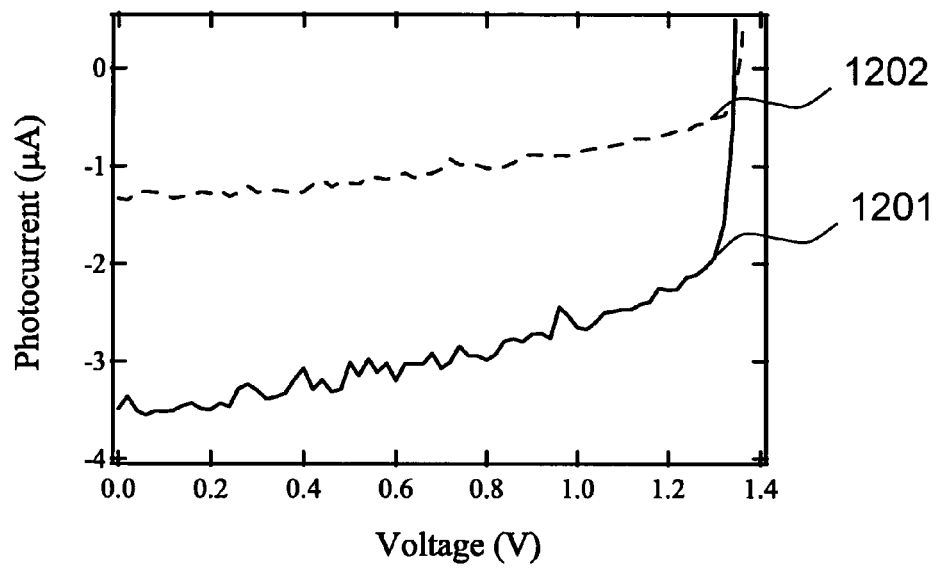
FIG. 12 shows the photocurrent-voltage characteristic with and without shaped structures protruding through the energy transfer region, thereby comparing enhancement in an example of a light harvesting device according to the first embodiment of the invention, where the energy transfer region is a single p-i-n junction.

To measure the photocurrent of the hybrid structures, the hybrid structures were excited at 570 nm by an optical parametric amplifier (OPA) with 200 fs width and 250 kHz repetition rate. The excitation wavelength was chosen to minimise the effect of the direct excitation to photocurrent. Photocurrent of the hybrid structures was measured at low temperature (25 K) and at room temperature using a Keithley 238. The current-voltage characteristics of the bare patterned heterostructure and the hybrid structure are shown in FIG. 12. Clearly, photocurrent of the hybrid patterned structure (1202) is higher than the photocurrent of the bare heterostructure (1201). The higher photocurrent is attributed to nonradiative energy transfer in the hybrid patterned structure. The advantage of the bulk heterostructure over the QW heterostructure used in other examples is the higher carrier transport. For the QW heterostructure, the low energy carriers may be trapped in the quantum wells whereas the high energy carriers can experience phonon scattering resulting in the photocurrent reduction. In contrast, there is no such obstruction in the bulk heterostructure. The NC fluorescence is deliberately chosen in close proximity to the band edge of the bulk heterostructure in order to decrease the possibility of the phonon scattering. As a result, the photocurrent of the hybrid bulk heterostructure is around two orders of magnitude higher than that of the hybrid QW heterostructure.

The photocurrent enhancement of the hybrid structure (H) is given by $I_{hybrid}/I_{bare}$ where $I_{hybrid}$ and $I_{bare}$ are the photocurrent of the hybrid and the bare structure respectively. As shown in FIG. 12, the photocurrent enhancement of the hybrid patterned structure ($H_p$=3.00) is higher than the enhancement of the hybrid flat-control structure ($H_f$=1.12) at 25 K. The slight increase of the hybrid flat structure is attributed to the conventional radiative energy transfer due where the QDs emit photons and the photons are subsequently absorbed by the active layer of the heterostructure. Nonradiative energy transfer has no effect on the photocurrent due to the large donor-acceptor separation distance. Unlike the hybrid patterned structure, the increase of the photocurrent is mainly due to efficient nonradiative energy transfer. The photocurrent enhancement of the hybrid patterned slightly decreases ($H_p$=2.44) at room temperature as a result of the lower quantum yield of the QDs at high temperature and the increasing nonradiative decay such as phonon scattering. However, the enhancement of the hybrid patterned structure still exceeds the enhancement of the hybrid control structure ($H_f$=1.07).

Although photocurrent enhancement of the hybrid patterned structure is higher than that of the control structure, the photocurrent per excitation area of the former is lower than that of the latter. In the patterning process, the active material is partly removed and the surface states introduced to the heterostructures are crucial to the efficiency of the hybrid structures. In the previous example the CdSe/CdS NCs capped with hexadecylamine, tri-n-octylphosphine oxide, and tri-n-octylphosphine were used. We demonstrated that the NCs could passivate surface states of channels facets and a 6-fold increase of photocurrent conversion efficiency was achieved. Unfortunately, the passivation of the surface states by the deposited QDs was not observed here. The width and the width of the channels can also be adjusted to optimise the photocurrent. In addition, photocurrent of the hybrid patterned structure can be improved by engineering the top contact that can take out photogenerated carriers more efficiently.

Hence the highly absorbing colloidal NCs are used to absorb photons from sunlight. Photogenerated carriers in the colloidal NCs are efficiently transferred to the high carrier mobility heterostructures via nonradiative energy transfer process and are converted to measurable electrical current. Photocurrent increases significantly after the deposition of the colloidal NCs into the bare patterned heterostructure. The photocurrent enhancement of the hybrid patterned structure up to 3 is observed which is higher than that of the hybrid unpatterned structure. This efficient scheme for light harvesting has an excellent potential for high efficiency photovoltaic cells and optoelectronic applications.

Second Embodiment of the Invention

In a second embodiment of the invention (where the refractive index of the enclosing structure shown in FIG. 1 (101-103) is larger than that of the shaped structures shown in FIG. 1 (105), a large proportion of emitted light becomes reflected back from the side walls of the shaped structures, due to Fresnel reflection at the low to high refractive index boundary at the surface interface, such that each shaped structure acts predominantly as a reflective cavity for light emitted from (or collected by) the light emitting (or light absorbing) particle providing further beneficial effects as will now be described.

Figure 13:
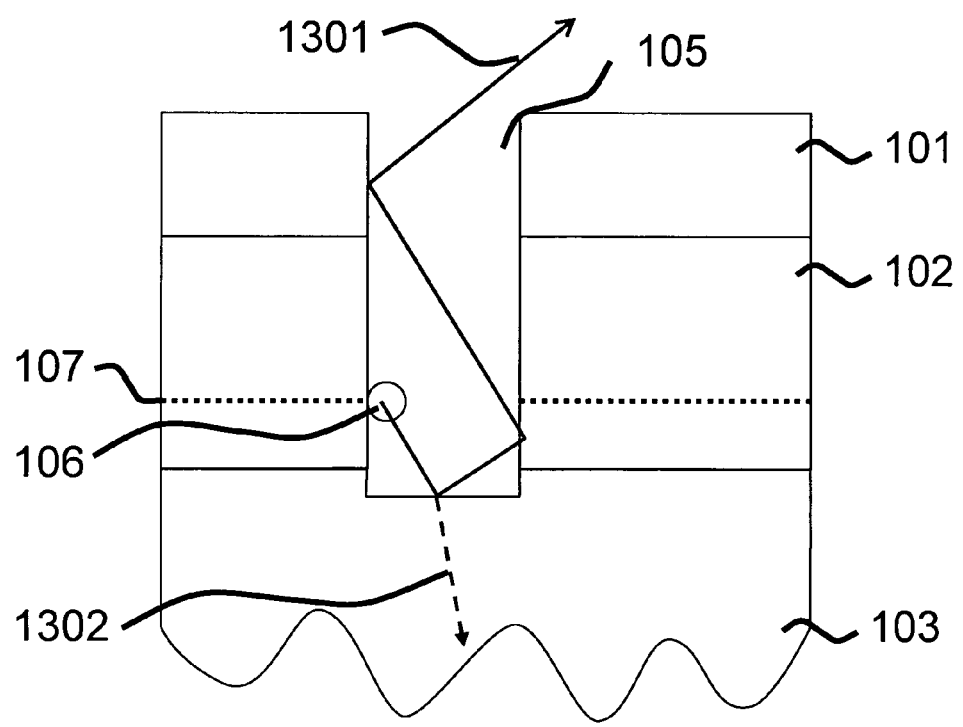
FIG. 13 shows the process of light emission from the optically responsive particle in more detail.

FIG. 13 shows in more detail the process of light emission from the optically responsive particle under such circumstances. A light ray (1301) emitted from a optically responsive particle (106) placed in close proximity to the energy transfer region (107), radiating towards the direction of the proximal heterostructure, becomes predominantly reflected from the internal surface of the shaped structure 105 such that it is redirected away from the bulk of the proximal heterostructure. A small amount of energy becomes transmitted into the underlying heterostructure in the form of a secondary light ray (1302). In practice the intensity of ray 1302 is less than that of 1301.

Hence, in the case of a light emitting device, light initially radiated towards the enclosing hetero-structure becomes predominantly redirected toward the forward emission direction. Furthermore, directionality (angular distribution) of the forward emitted light can additionally be controlled by sculpturing the cross sectional profile of the enclosing shaped structure. Such sculpting could include but is not limited to: tapered, spherical or elliptical profiles. Geometrical parameters such as width, depth and pattern of arrangement of the shaped structures then determine the angular distribution of power in the far field emission profile of the light emitting device.

Figure 14:
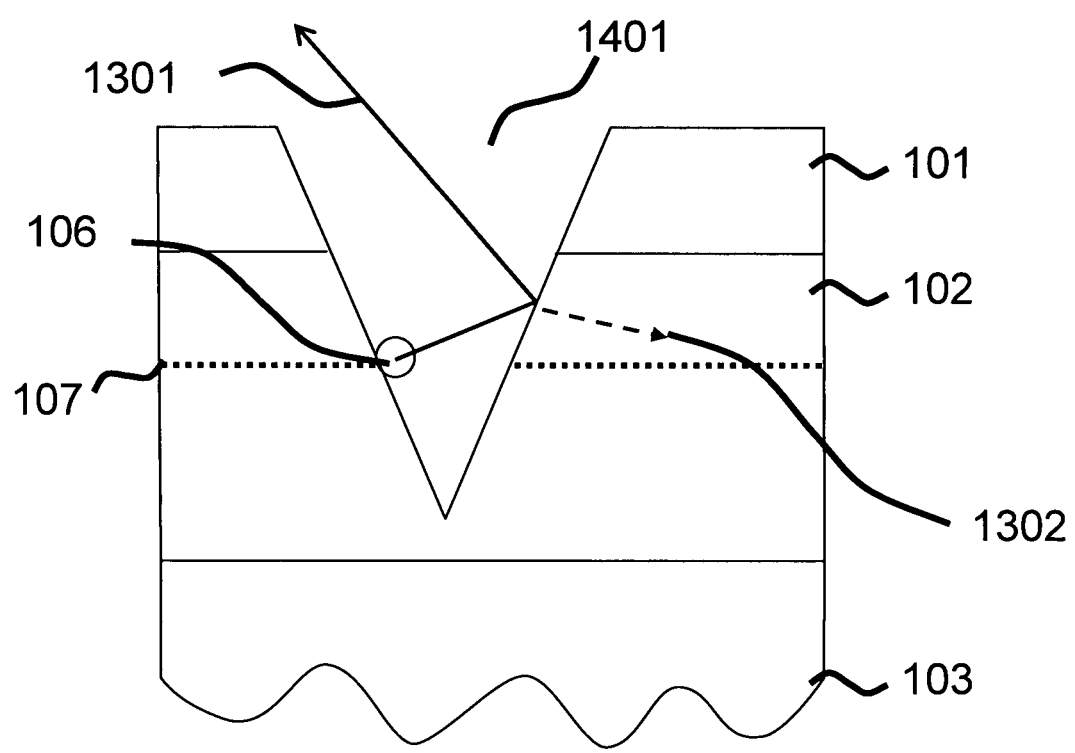
FIG. 14 depicts an arrangement according to the second embodiment where the shaped structure takes the form of inverted pits or pyramids.
Figure 15:
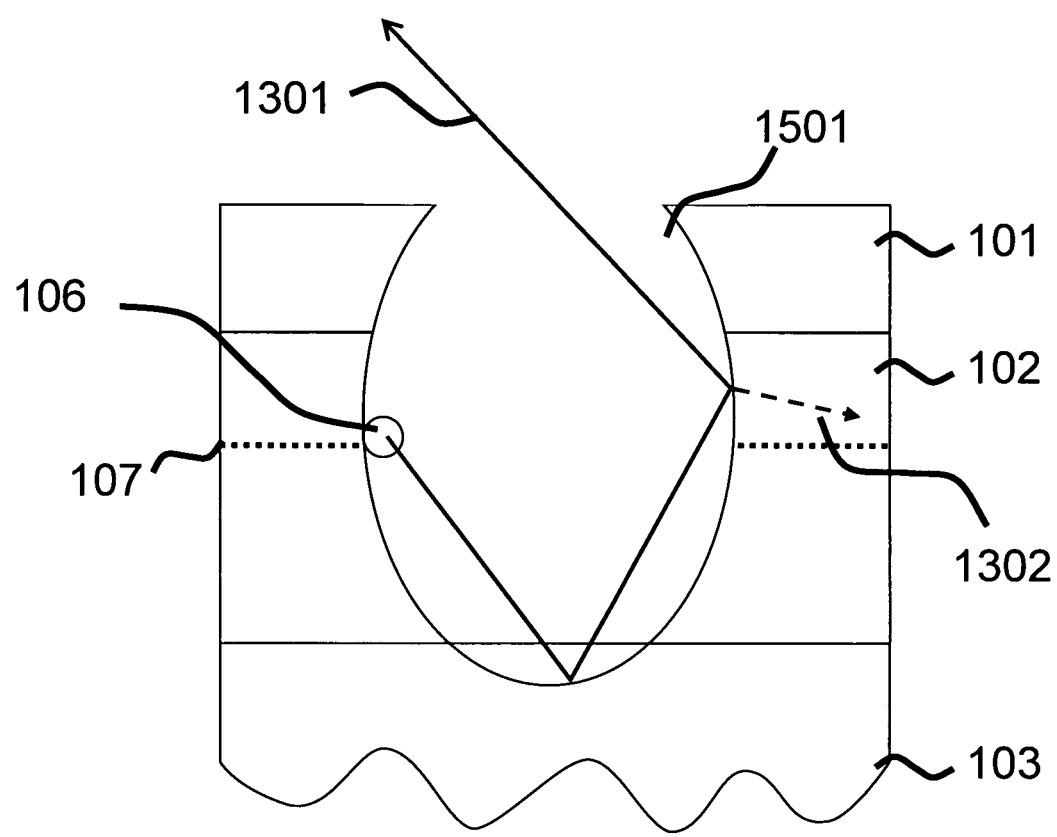
FIG. 15 depicts an arrangement according to the second embodiment where the shaped structure takes the form of spherical or elliptical voids.

For example, FIG. 14 depicts an arrangement where the shaped structure take the form of inverted pits or pyramids (1401). FIG. 15 shows an arrangement where the shaped structure takes the form of spherical or elliptical voids (1501).

In the case of a light harvesting device according to the second embodiment of the invention, the cross-sectional shape of the shaped structure can be designed such that incident light becomes strongly localised at the spatial position of the optically responsive particles (in the vicinity of the energy transfer regions) such that individual shaped structures perform the function of concentrating incident light onto the nano-particles, thereby improving collection efficiency of incident photons by the nano-particles.

Figure 16:
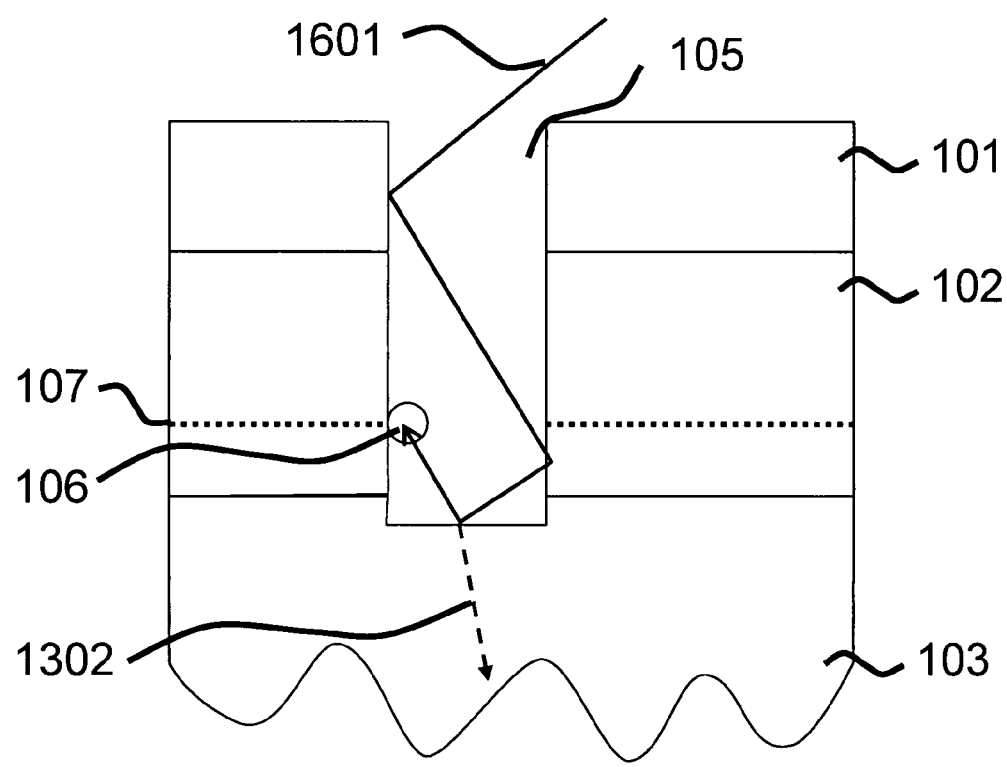
FIG. 16 depicts an arrangement according to the second embodiment where the device acts as a solar collector.

FIG. 16 depicts an arrangement where the device acts as a solar collector. In this case a light ray impinging upon the structure (1601) becomes absorbed by the optically responsive particle (106) placed in close proximity to a energy transfer region (107), which then subsequently transfers energy non radiatively to the enclosing structure, such that an electron hole pair is generated inside regions 101-103. The generated photo-current would then be conducted away from the energy transfer region under the influence of an induced electric field within the enclosing structure, and conducted to an external circuit via electrical contacts made to regions 101 and 103 (not shown in the figure).

It is also possible for the incident (or generated) light to form reduced group velocity waves within the shaped structures in the form of 'cavity modes'. For clarity 'cavity modes' reside within the spatial regions of the shaped structures not in the bulk of the enclosing heterostructure (as is the case for a conventional LED or solar cell). The existence of cavity modes' relates to the quality factor of the microcavity formed by the enclosing structure.

Spatial localisation of light due to cavity mode formation need not necessarily be concentrated at the side walls of the shaped structure but may occur anywhere within the shaped structure and the benefits of cavity modes is applicable to both solar collection devices and light emitting devices. Spatial field localisation effects associated with cavity modes are depicted in more detail in FIGS. 17A to 17D.

Figure 17A:
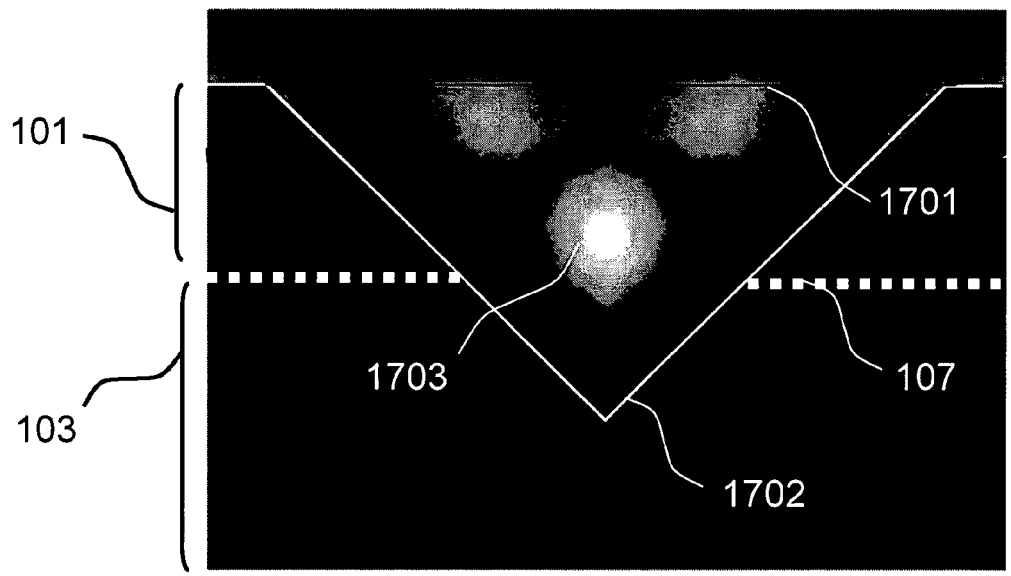
FIG. 17A depicts field intensity localisation within an inverted pit shaped structure due to weak or strong micro-cavity effects.

FIG. 17A shows the spatial field localisation within a shaped structure with cross sectional shape taking the form of an inverted pyramid. Feature 1701 represents the back wall of the shaped structure, while 1702 represents the side wall interface of the shaped structure. The grey scaled region 1703 represents the intensity of the optical field within the shaped structure under external illumination (in the case of a solar energy harvesting device) or resultant from photon emission from optically responsive particles disposed within the shaped structure (in the case of a light emission).

Figure 17B:
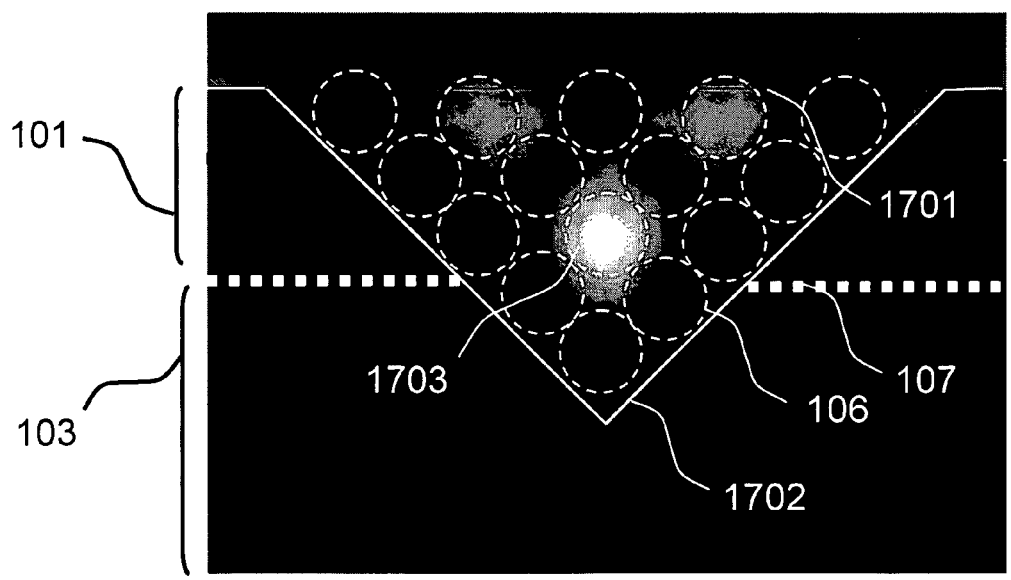
FIGS. 17B, 17C and 17D depict overlap between field intensity within an inverted pit shaped structure (as a result of weak or strong micro-cavity effects) and optically responsive particles for several possible arrangements for the optically responsive particles.

FIG. 17B shows a configuration whereby the shaped structure is entirely filled with light absorbing or emitting particles (106), illustrating the spatial overlap between the strong optical field at the centre of the shaped structure with the light emitting or absorbing particles.

Figure 17C:
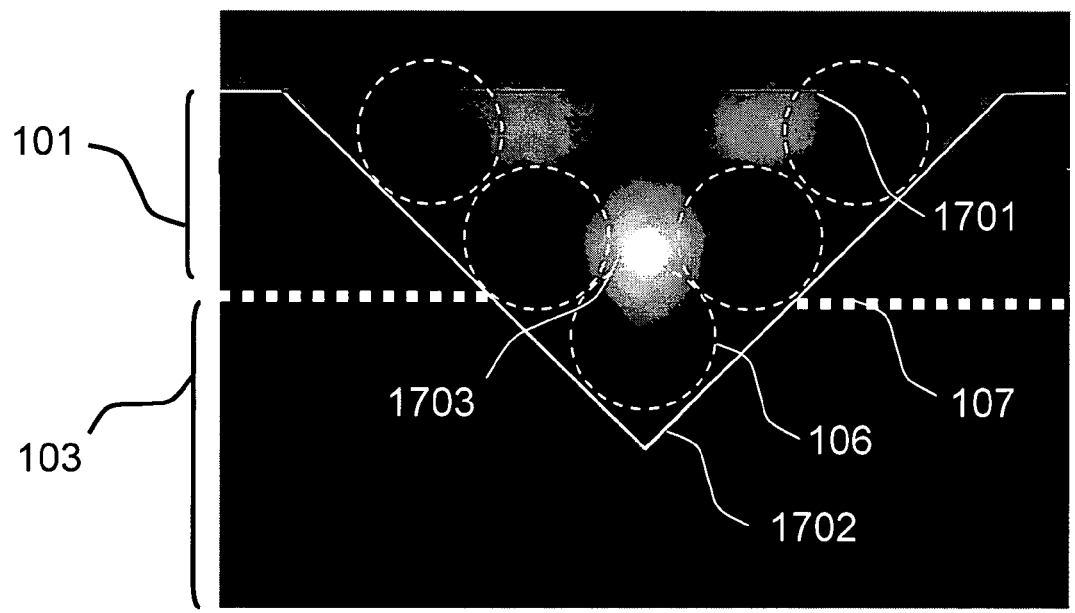

FIG. 17C shows a configuration whereby light emitting or absorbing particles are disposed predominantly along the side walls of the shaped structures, the strong optical field intensity at the centre of the shaped structure (1703) overlaps spatially with one or more of the optically responsive particles.

Figure 17D:
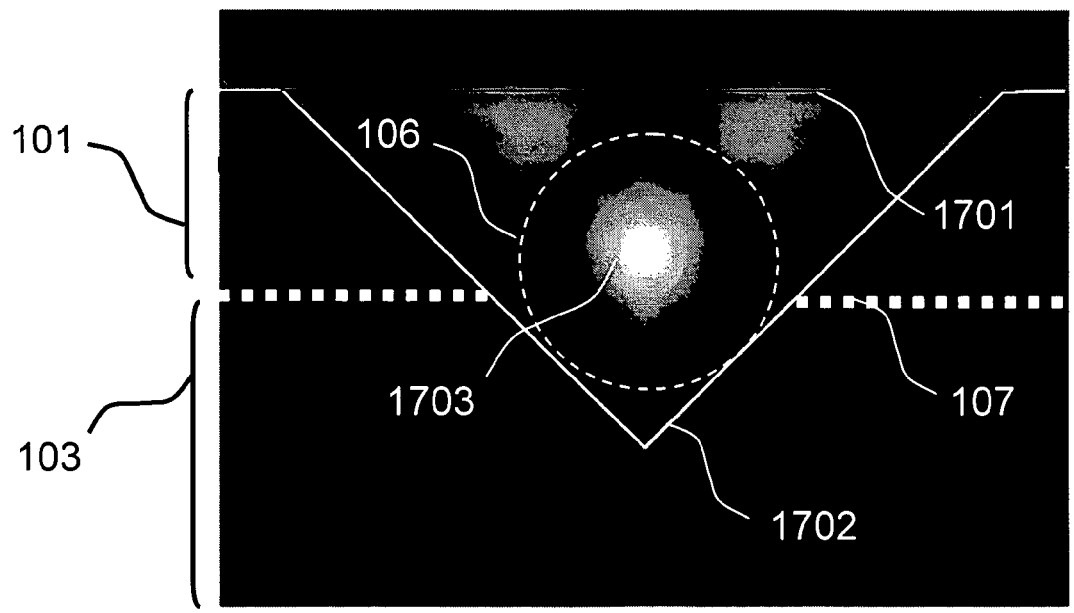

FIG. 17D shows a configuration whereby a single optically responsive particle is disposed predominantly towards the centre of the shaped structure such that the strong optical field intensity at the centre of the shaped structure (1703) overlaps largely with the optically responsive particle.

The configuration depicted in FIG. 17D would be suitable to implement a single photon detector, or a single photon emitter dependent upon the relative configurations of the band gap energies of the enclosing structure and the light emitting/absorbing particle.

An alternative mechanism to improve the efficiency of energy conversion would be to utilise surface localisation effects within the shaped structure. This can be achieved by the induction and utilisation of surface plasmons. Surface plasmons are optical waves which reside along and/or are bound to the side wall interface of the shaped structures, and possess field intensities which are very strongly localised in the regions of the side walls of the shaped structures.

Figure 18:
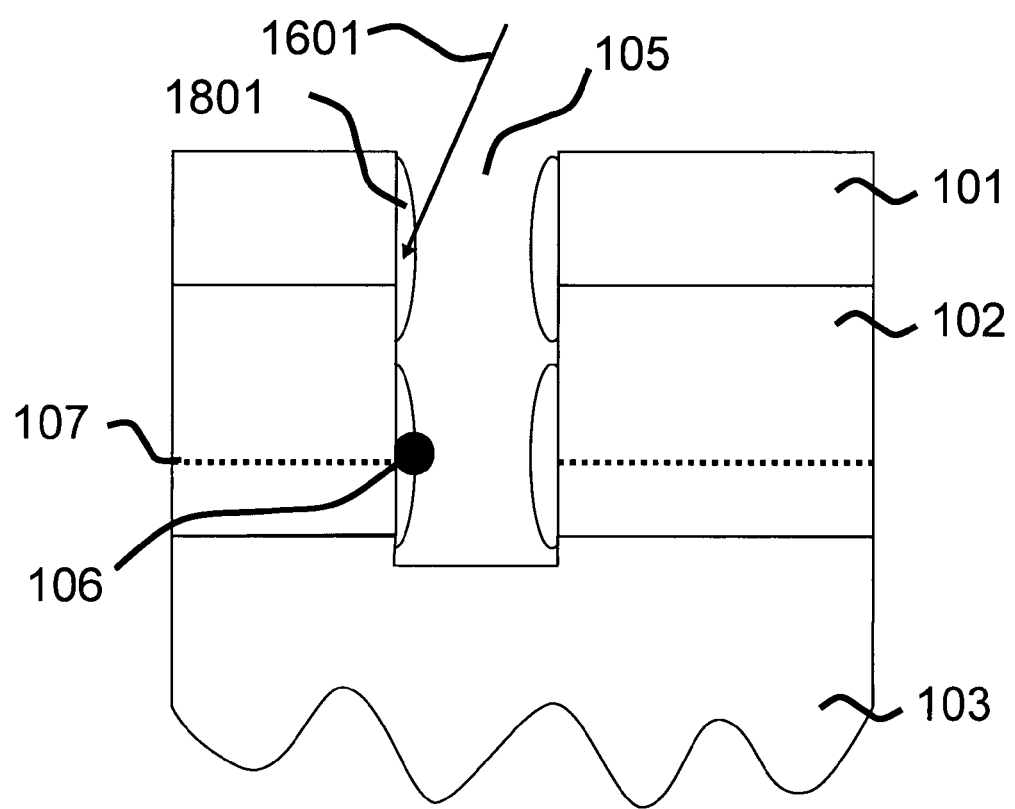
FIG. 18 depicts an arrangement according to the second embodiment where an impinging light ray is reflected onto the regions where the optically responsive particles are disposed.

Utilisation of surface plasmon effects is depicted in FIG. 18. An impinging light ray (1601) is reflected onto the regions where the light emitting or absorbing particles are disposed, which in turn couples to or induces a surface plasmon wave residing on the side walls of the shaped structure. Feature 1801 represents the localised field intensity of the surface plasmon wave. The plasmon intensity profile may have several lobes dependent upon the order of the mode of the standing wave.

Figure 19A:
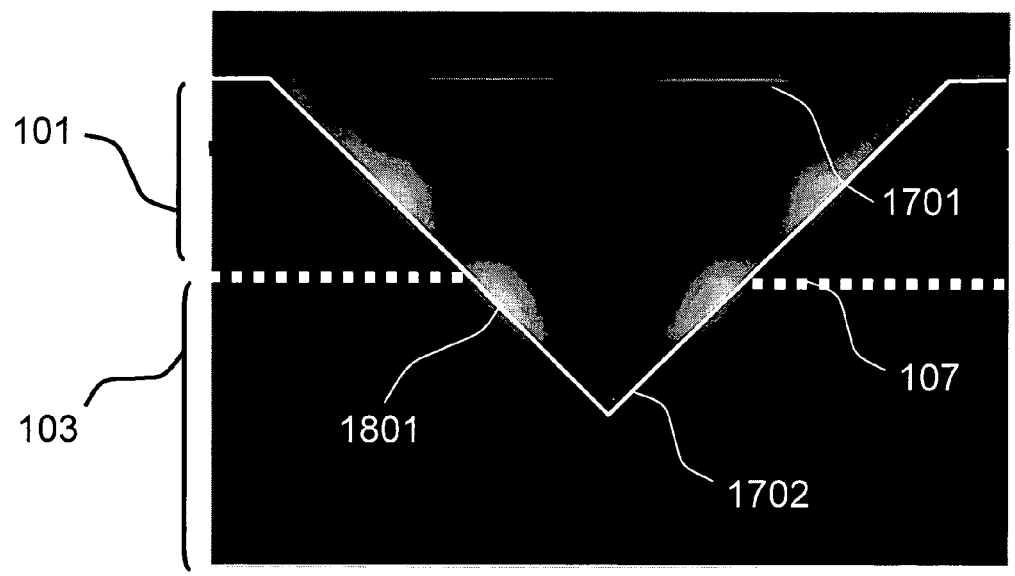
FIG. 19A depicts field intensity localisation effects within a pit shaped structure due to weak or strong surface plasmon effects.
Figure 19B:
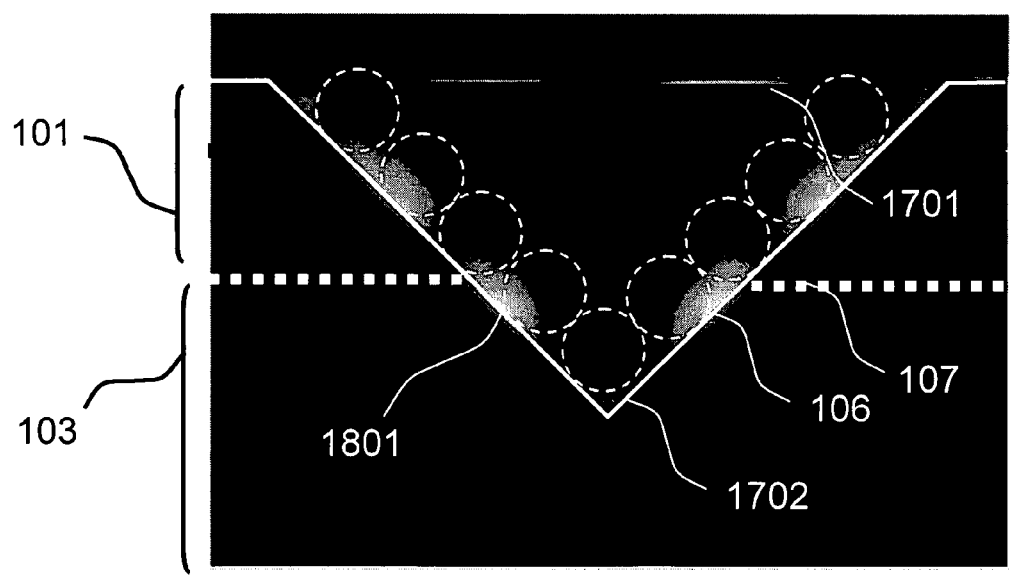
FIG. 19B depict overlap between surface plasmon field intensity within an inverted pit shaped structure and optically responsive particles disposed on the side walls of the shaped structure.
Figure 19C:
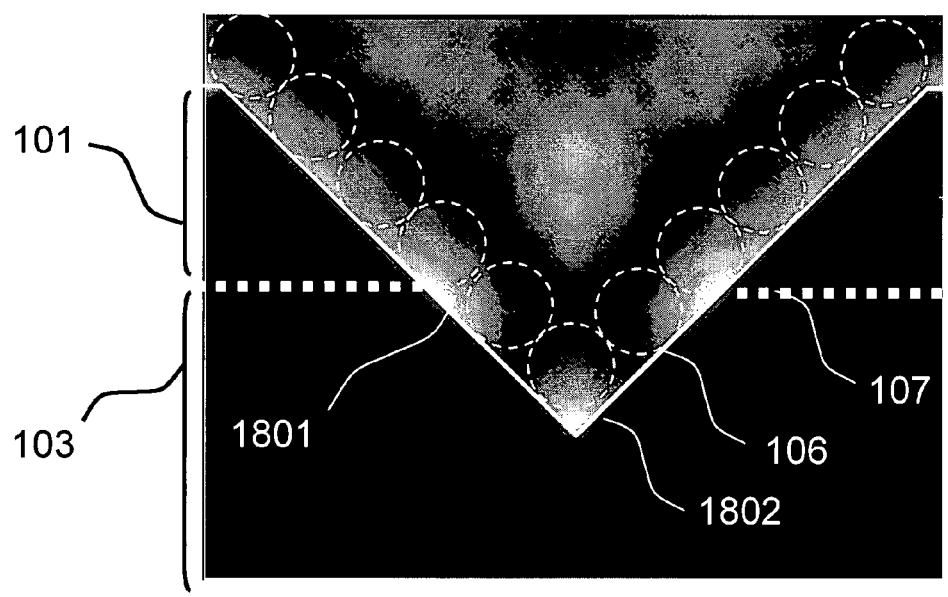
FIG. 19C depict simultaneous overlap between both localised surface plasmon field intensity and localised micro-cavity mode field intensity within an inverted pit shaped structure and optically responsive particles disposed on the side walls of the shaped structure.

FIGS. 19A to 19C show field localisation effects due to surface plasmon effects in more detail within a shaped structure with cross sectional shape taking the from of an inverted pyramid. FIG. 19A illustrates the field localisation more clearly, for a second order cavity plasmon mode. FIG. 19B illustrates the spatial overlap between the surface plasmon mode and light emitting or collecting particles. FIG. 19C shows an example of a cavity plasmon mode whose intensity is not so strongly localised into distinct spatial lobes but is more uniformly distributed along the side walls of the shaped structure. This arrangement provides the benefit of improved transfer of optical energy to or from a larger number of light absorbing or emitting particles dispersed along the side all of the shaped structure.

In the case that the shaped structure supports a near-stationary mode, the Quality factor of the resultant enclosing cavity mode or plasmon cavity modes can become very large. In this case the shaped structure provides a strong "microcavity" environment for the enclosed optically responsive particles, and stimulated emission can occur. Alternatively, the rate of emission per particle can be increased. Taken to extremes this may lead to lasing within the shaped structures.

Figure 20:
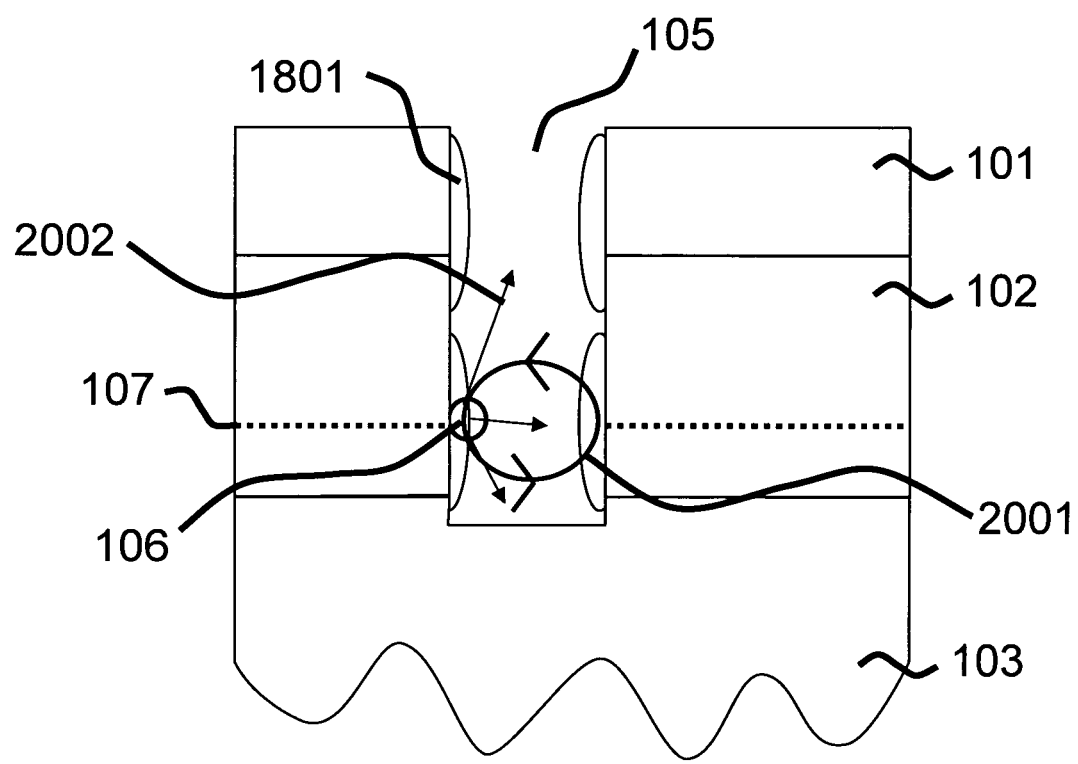
FIG. 20 depicts an arrangement according to the second embodiment whereby the shaped structure provides a microcavity environment for radiated light such that a localised standing wave is set up within the shaped structure causing increased rate of emission.

FIG. 20 depicts an arrangement where the shaped structure provides a microcavity environment for radiated light from the optically responsive particle such that a predominantly localised standing wave is set up within the shaped structure (by process of multiple internal reflection), whose field localisation properties may take the form as depicted in FIGS. 17A-D and 19A-C, such that photon recycling occurs (2001) and the emission rate of the particle becomes increased and further photons are emitted (2002). In extreme case of this arrangement photon recycling leads to amplified spontaneous emission and the device may form a Laser.

Third Embodiment of the Invention

Figure 21:
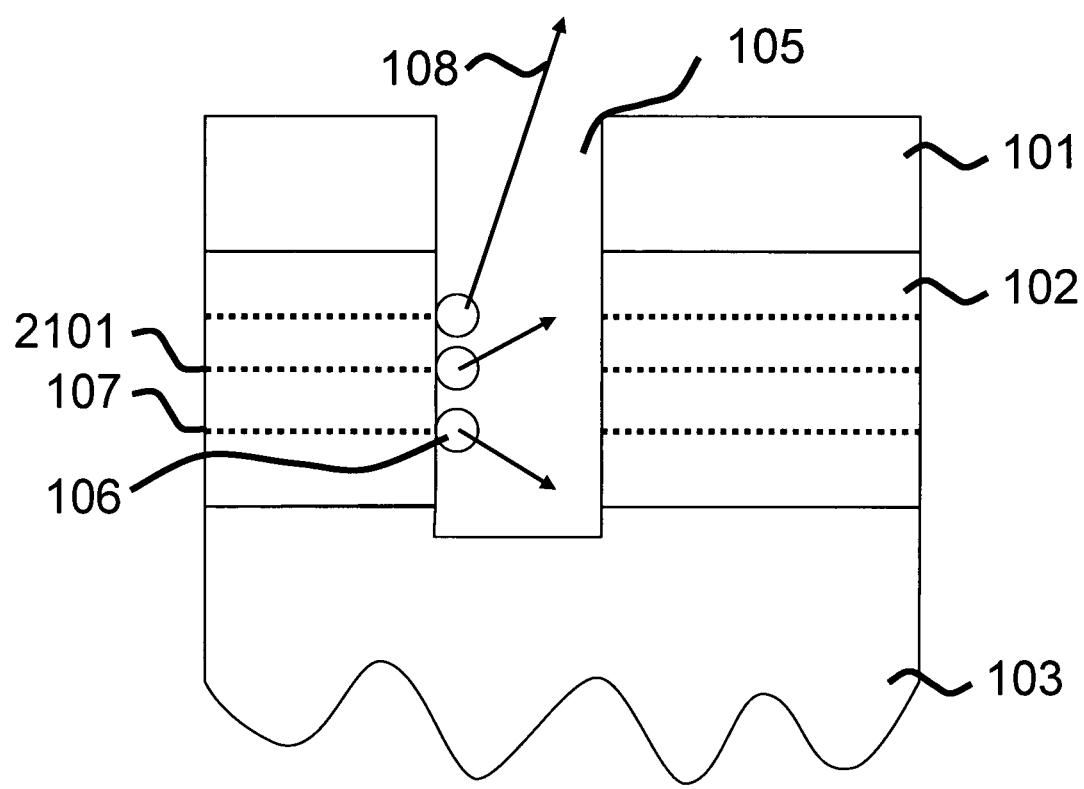
FIG. 21 depicts an arrangement according to the third embodiment incorporating more than one quantum well such that light emission is increased.

In a third embodiment of the invention, the enclosing structure incorporates a number of energy transfer regions perforated by a shaped structure (FIG. 21) such that more than one energy transfer region (2101) participates in the non-radiative energy transfer process to or from the colloidal nanoparticles. In this embodiment of the invention emission power (brightness), or collection efficiency, scales with number of perforated quantum wells.

Fourth Embodiment of the Invention

A fourth embodiment of the invention utilises convoluted shapes for the etched structures such that the length of perimeter in contact with the quantum well is maximised. Such geometries could include (but are not limited to) fractals, convoluted spirals, mesoporous (sponge like) geometries, geometric shapes with inwardly pointing filaments, and provide the benefit of increasing the area of emission.

Fifth Embodiment of the Invention

In a fifth embodiment of the invention, multiple sets of shaped structures perforate the energy transfer region, and may be arranged: randomly, in periodic lattices with symmetries from 1-6, or in quasi-periodic lattices such that efficiency of light extraction (or collection) per unit surface area of the device is increased.

It should be appreciated that quasi-periodic lattices include those with long range order but short range disorder in real lattice space, and whose Fourier transform of the centre positions of the shaped structures, reveals Bragg peaks with a level of symmetry larger than 6 in reciprocal lattice space. Quasi-periodic lattice includes Fibonacci lattices and other with levels of symmetry approaching infinity.

Random arrangements include 'amorphous arrangements' and those with irregular nearest neighbour centre to centre spacing for the shaped structures, and whose Fourier transform of the centre positions of the shaped structures does not reveal clearly periodic Bragg peeks.

Our definition of periodic, non-periodic and quasi-periodic include structures where multiple shaped structures are placed in such arrangements or lattices, but whose size or cross-sectional shape is not the same throughout the arrangement or lattice. For example, shaped structures may be arranged in a particular lattice but may have differing cross-sectional areas or cross-sectional shapes.

Figure 22A:
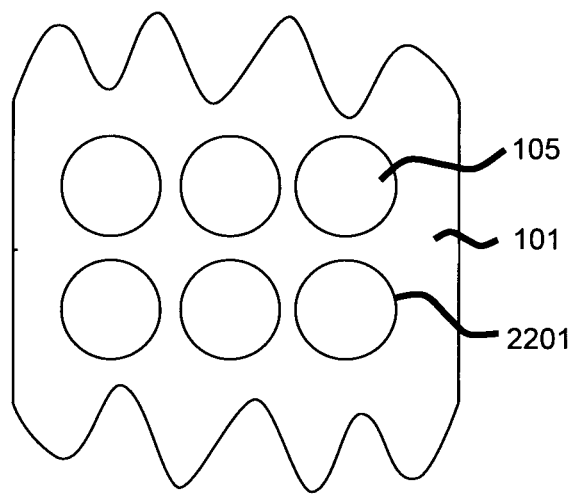
FIGS. 22A, 22B and 22C depict several arrangements where the form of the shaped structures is selected to increase the internal perimeter according to the fourth embodiment of the invention and where shaped structures are also arranged into ordered arrays according to the fifth embodiment of the invention.
Figure 22B:
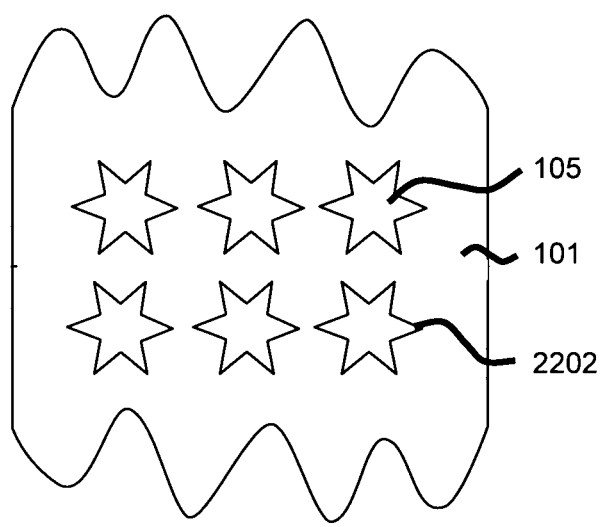
Figure 22C:
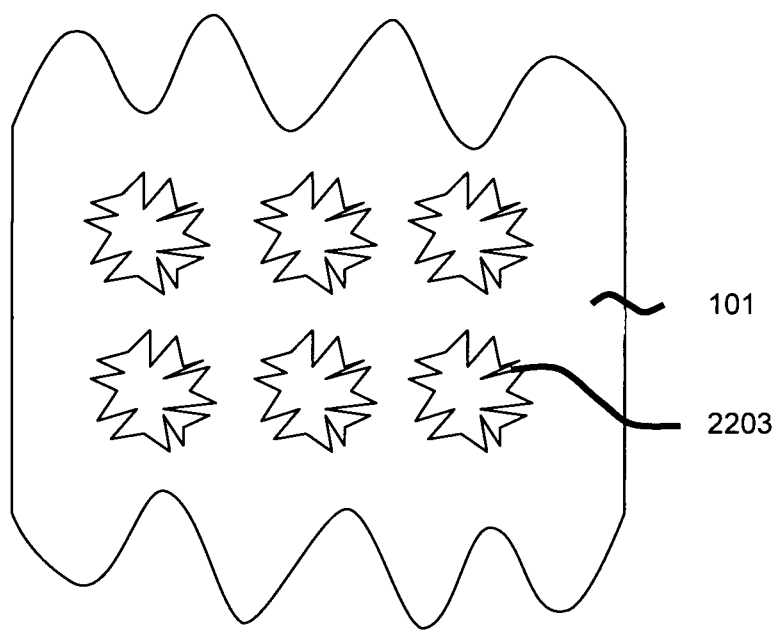

FIGS. 22A, 22B and 22C illustrates a few cross sectional shapes for the shaped structures (in accordance with embodiment 4), arranged into a regular (square) lattice (in accordance with embodiment 5). An example is shown where the shaped structures take the form cylindrical rods (2201), n-pointed stars (2202), random ragged edged structures (2203) which could take the form of a meso-porous sponge like shape. Alternatively, ordered jagged edges structures, such as fractals or shapes with inwardly pointing filaments or rods, could be used.

In a second case of the fifth embodiment of the invention, the arrangement of shaped structures is chosen to maximise the packing density of the shaped structures. This provides the benefit of maximising the total summed perimeter of shaped structures per unit surface area and thus in turn provide increased efficiency of energy transfer.

In a third case of the fifth embodiment, the maximum length of the connecting material bridge between neighbouring etched shaped structures corresponds to (or is less than) the non radiative diffusion length of the exciton within the heterostructures. This ensures that radiative recombination of excitons is effectively inhibited in the bulk of the enclosing heterostructure and therefore maximises efficiency of non radiative energy transfer to (or from) light emitting (or absorbing) particles.

Figure 23:
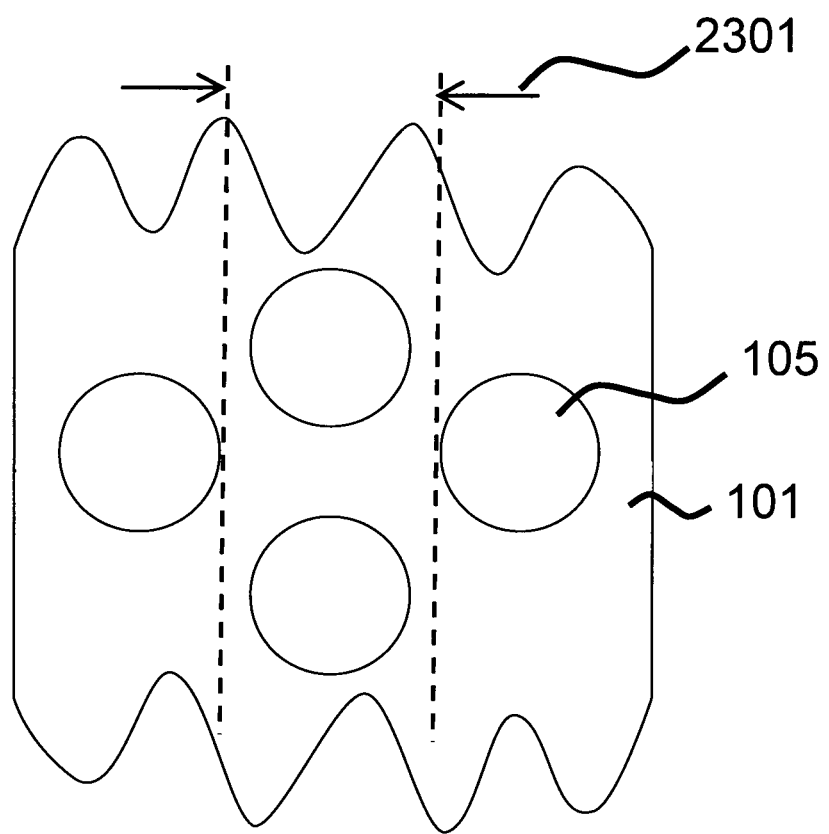
FIG. 23 depicts an arrangement according to the fifth embodiment where the maximum distance between proximal shaped structures is minimised to ensure that it is less than the recombination distance in the material.

FIG. 23 depicts an arrangement according to the fifth embodiment where the maximum distance between proximal shaped structures (2301) is minimised to ensure that it is less than the exciton recombination distance in the material. The arrangement of shaped structures could be random, periodic, quasi-periodic or amorphous.

Figure 24:
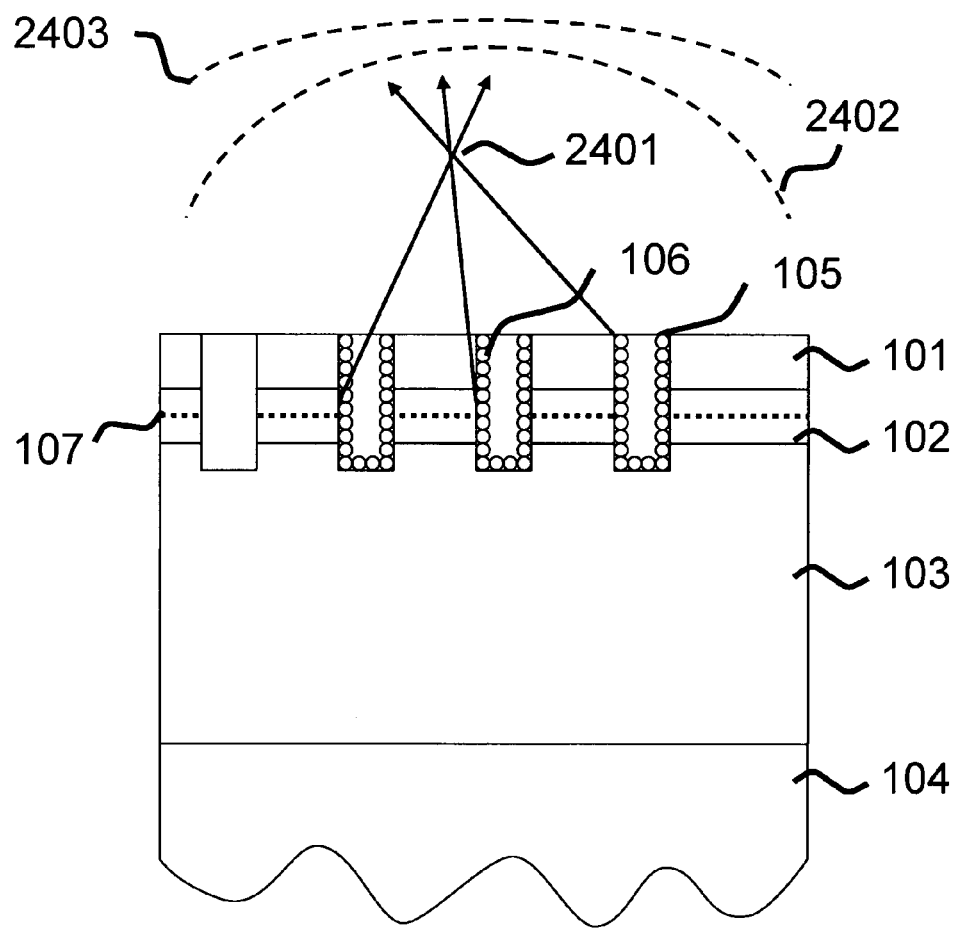
FIG. 24 depicts an arrangement according to the fifth embodiment where the shaped structures are arranged to provide beneficial interference in the far-field such that the overall shape of the emitted wavefront can be modified

In a fourth example of the fifth embodiment of the invention, the cross sectional shape of shaped and spatial arrangement of structures placed within an array of otherwise optically isolated shaped structures, is selected to provide both increased light extraction efficiency per unit surface area (associated with the array arrangement) of the device, and beneficial beam shaping (associated with the cross sectional shape of the etched structure) through summation of projected emissions from individual shaped structures in the far field, such that overall the angular power distribution of the far field emission profile (in the case of a light emitting device), or the angular acceptance cone (in the case of a light harvesting device), deviates from a standard Lambertian as would normally be the case for a conventional LED or solar cell utilising random surface roughening. This is illustrated in FIG. 24. An array of shaped structures are arranged to provide beneficial interference (2401) in the far-field such that the overall shape of the emitted wavefront (2402) can be modified (2403).

Sixth Embodiment of the Invention

In a sixth embodiment of the invention a multitude of shaped structures are arranged such that they form arrays of partially coupled microcavities, whereby coupling between optical fields (and wave-functions) emitted from optically responsive particles within individual shaped structures induce coherence in emission of photons over the distance range of several shaped structures, such that overall, the angular power distribution of the far field emission profile (in the case of a light emitting device), or the angular acceptance cone (in the case of a light harvesting device), deviates from a standard Lambertian as would be the case for a conventional LED or solar cell.

Such cross coupling can occur through interactions between optical fields partially transmitted through the bulk of the dielectric material of the enclosing heterostructure (rays 1302 in FIGS. 13 to 16) and is not limited to nearest neighbour interactions between shaped structures but can occur over the length scale of several shaped structures.

Alternatively, cross coupling can occur entirely external to the bulk of the enclosing structure via utilisation of surface plasmons which reside and propagate on the surface of the device in spatial regions of the interconnecting ribs between shaped structures. This embodiment of the invention provides a further key design advantage. The number of modes which contribute to the emission or collection process is limited and is in fact determined by the geometry (width and depth) of the shaped structures. By designing the overall structure such that individual shaped structures support only one or two cavity or cavity plasmon modes, but still perforate a large number of closely spaced energy transfer regions, very unusual beam patterns can be easily obtained in conjunction with high emission efficiencies. In the case of a light emitting device, such beam patterns could include high directionality (reduced angular cone), uniform intensity far fields or structured far field patterns such as extreme bat-wings with very narrow polar angular emission cones. Such beam profiles would be beneficial for applications such as display backlight unit illumination and general lighting.

Figure 25A:
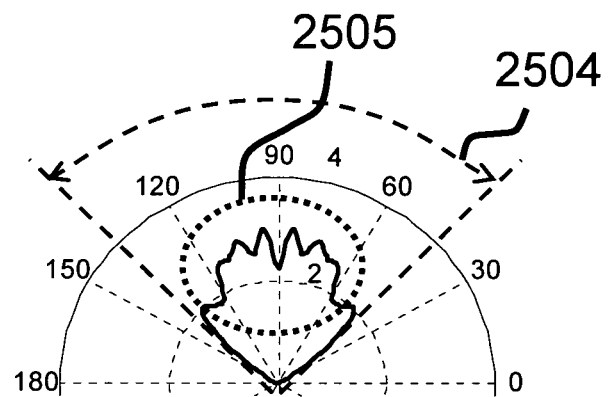
FIG. 25A shows examples of shaped field profiles according to the sixth embodiment, wherein the arrangement of shaped structures gives rise to a broad far field angular emission profile.
Figure 25B:
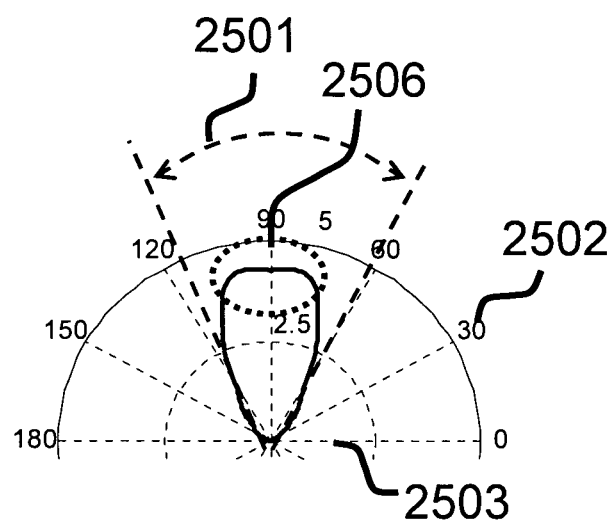
FIG. 25B shows examples of shaped field profiles according to the sixth embodiment, whereby the arrangement of shaped structures gives rise to a narrow far field angular emission profile.

FIGS. 25A and 25B show examples of polar angle plots of achievable far field profiles. FIG. 25A depicts a reduced angular cone emission profile (2501). On the polar diagram angular axis 2502 represents angle of emission, radial distance from the origin (2503) represents amplitude (intensity) of emission. In this case a near flat-top far field profile (2501) is obtained over a limited angular range of emission. FIG. 25B shows a device with a deliberately increased angular emission cone (2504), with a more Lambertian far field profile (2505) over the angular cone of emission.

The choice of lattice arrangement plays an important role in determining the uniformity of the far field profile with respect to azimuth angle (not shown in FIGS. 25A and 25B). For example, use of regular square or triangular lattice shapes will result in considerable variation in intensity profile with azimuth angle for a given polar angle, and thus will affect overall uniformity of intensity of the far field profile. Highly uniform far field profiles (with respect to azimuth angle) can be obtained through use of higher order symmetry lattice arrangements such as Fibonacci or quasi-crystal.

In the sixth embodiment of the invention, light emission occurs within the shaped structures and is predominantly external to the bulk of the heterostructure. The shaped structures predominantly act as reflectors, and so overall there is little light coupled to (or trapped within) the bulk of the enclosing heterostructure. By contrast, in the case of a conventional LED, light emission is internal to the bulk of the heterostructure material, and surface texturing (if present) performs the function of providing additional leakage paths to redirect confined modes to radiation modes (via multiple scattering events) hence in that case surface texturing provides an extraction mechanism for confined modes.

In addition conventional LEDs employ very thick epitaxy layers, which support a very large number of trapped modes. This makes it very difficult to achieve very narrow angular emission profiles, even if utilising photonic crystals. Thus, the present invention also solves a fundamental limitation for conventional Photonic crystal LEDs, by ensuring that a very small number of modes are actively involved in the emission process allowing good control over emission profiles.

A seventh embodiment of the invention concerns the arrangement of the top contact to the enclosing heterostructure and overcomes limitations relating to optical extraction and contact resistance in conventional LEDs.

Figure 26:
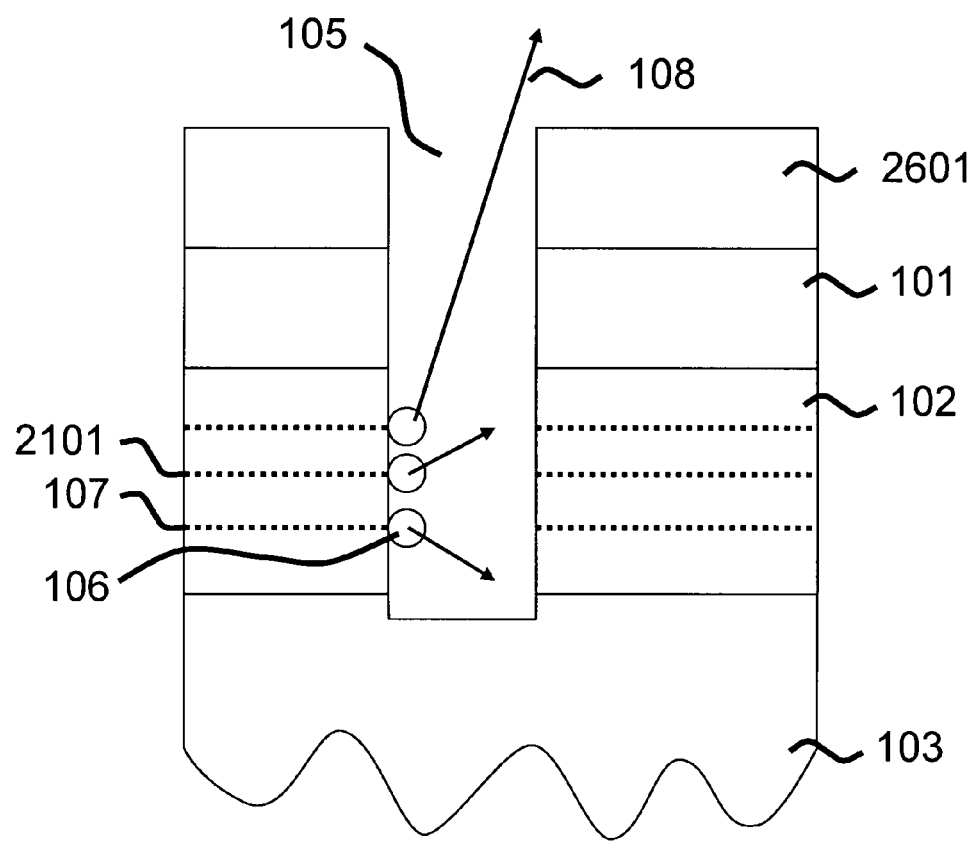
FIG. 26 shows an example according to the eighth embodiment, including a non transparent top contact; and, FIGS. 27A to 27J illustrate the steps of an example fabrication process flow for fabricating devices according to the present invention.

In an eighth embodiment of the invention, as shown in FIG. 26, the top surface of the device is coated with an optically opaque metal contact layer (2601) with shaped structures disposed through this top contact layer and the underlying heterostructure (101-103). In contrast to conventional LEDs OLED devices and solar cells, this embodiment of the invention allows the top contact stack (2601) to be arbitrarily designed (in respect of materials used) to minimise contact resistance to the underlying heterostructure thereby providing means of improvement in electrical contact to the bulk of the heterostructure which further improves overall efficiency of generation of contributory exciton pairs in the Quantum Well layers.

This embodiment of the invention is significantly different to that utilised in a conventional LED. In a conventional LED, the top contact must either be entirely transparent (usually made from Indium Tin Oxide), or must be small in area and used in conjunction with an underlying partially conductive current spreading layer. This requirement constrains the ultimate contact resistance which can be obtained to the heterostructure and limits overall efficiency of the LED since the transparent top contact layer imparts further optical loss and increased contact resistance which in turn causes increased forward switch on voltage.

In this embodiment of the invention, light emission is entirely from within the spatial regions of the shaped structures, and we are at liberty to cover the interconnecting top surface (between shaped structures) with an optically opaque and physically thick solid metal layer, allowing the top contact stack structure to be arbitrarily designed to minimise contact resistance to the underlying heterostructure thereby improving efficiency of generation of contributory exciton pairs in the energy transfer region.

Furthermore the use of a non transparent highly conductive top surface provides a means to support surface Plasmon modes which subsequently provide a mechanism to cross-couple neighbouring shaped structures to one another, over length scales of several microns to provide the far field beam shaping effects (as described in embodiment 7).

Methods of Fabrication

All embodiments of the present invention can currently be realised through conventional semiconductor processing techniques. Fabrication methods for conventional LED heterostructures, solar cells, and OLED devices are well known and so will not be described in detail here. Shaped structures can be patterned by electron beam lithography and semiconductor dry etching techniques. Alternatively, ion beam milling can be employed. For the purpose of mass production, shaped structures could be defined by (but methods are not limited to) conventional photo-lithography, contact lithography, deep UV lithography, X-ray lithography, nano-imprint, hot embossing dependent upon the chosen dimensions.

Figure 27A:
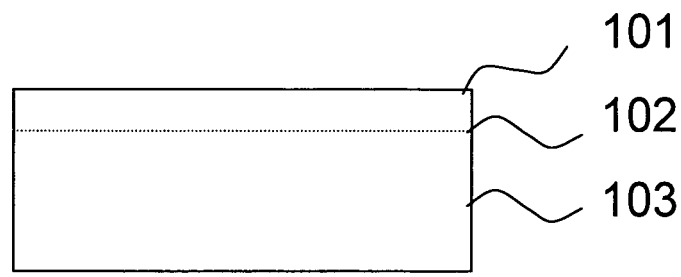

FIGS. 27A to 27J illustrate the steps of an example fabrication process flow for fabricating devices according to the present invention, starting with a bare epitaxial substrate, as shown in FIG. 27A.

Figure 27B:

With reference to FIG. 27B, electrical contact layers (271) can be deposited onto the epitaxial substrate by a variety of methods including: sputtering, thermal evaporation, e-gun evaporation, and electrodeposition. The contacts may consist of transparent contact materials including Indium Tin Oxide, Aluminium Zinc Oxide, or alternatively a multi-layer stack comprising several metals (such as nickel, chrome, Aluminium, gold) which are selected to provide both good adhesion to the top surface of the epitaxial structure, to provide a good Ohmic contact, provide high electrical and thermal conductivity, and to be suitable for wire bonding or other electrical contact methods.

Figure 27C:
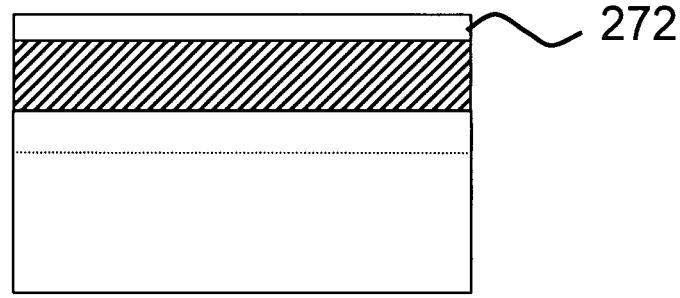

As shown in FIG. 27C, a hard mask (272) may then be deposited on top of the contact layer. Such a hard mask could consist of a dielectric material such as $SiO_2$, or SiN. The hard mask is selected to have high resistance to the particular etch process to be used to transfer shaped structures through the metal layer.

Figure 27D:
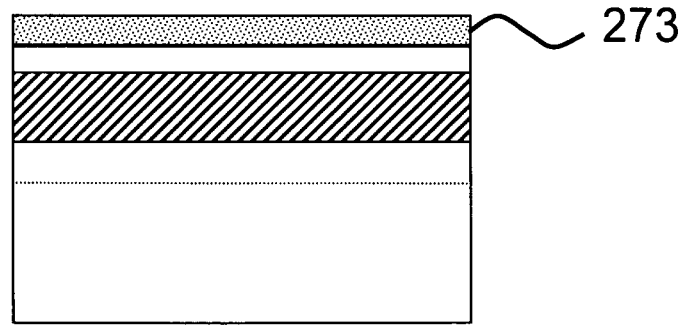
Figure 27E:
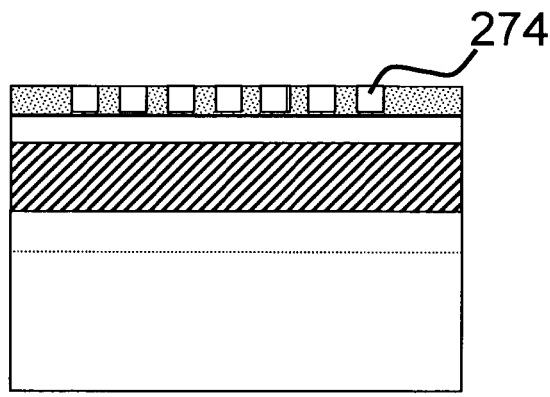

As shown in FIG. 27D, a light or electron sensitive layer (photo-resist) (273) is then deposited by drop and spin coating on top of the metal layer. This layer is patterned by means of a suitable technique, such as conventional optical lithography, nano-imprint lithography, or electron lithography, and developed to form shaped voids (274) at predefined positions in the photo-resist, as shown in FIG. 27E.

Figure 27F:
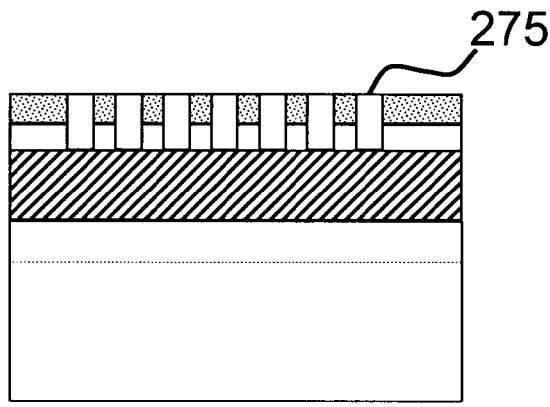
Figure 27G:
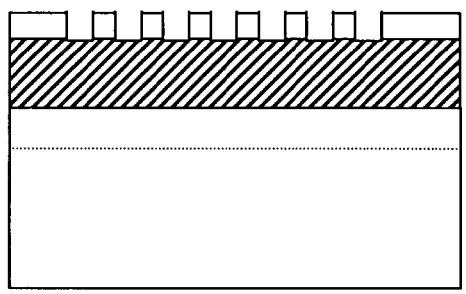

As shown in FIG. 27F, the pattern is then transferred to the underlying hard mask material (275) by wet chemical etching, reactive ion etching, ion beam milling or Inductive coupled plasma etching. The remaining residual photoresist is removed by acid or solvent wash or oxygen plasma ashing, as shown in FIG. 27G.

Figure 27H:
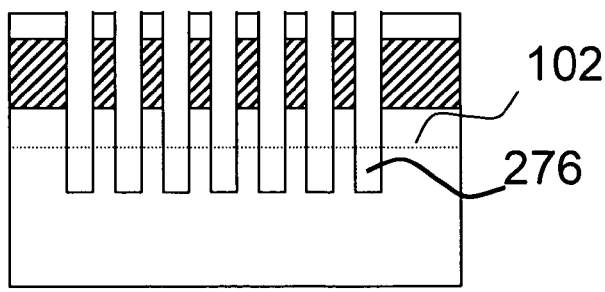

The pattern is then transferred from the hard mask through both the underlying metal contact stack and the epitaxial substrate (276) using an appropriate etch process, as shown in FIG. 27H. An example of a process suitable for both metal contact layer and GaN would be a Chlorine/Oxygen based inductively couple plasma etch process.

Figure 27I:
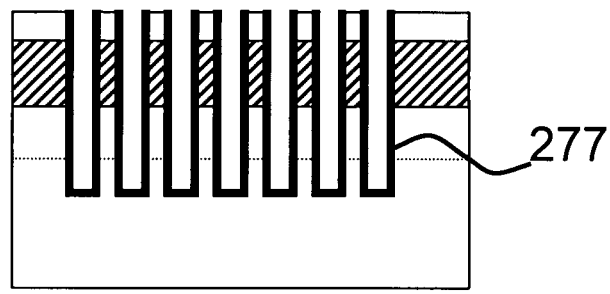

As shown in FIG. 27I, a passivation layer (277) can then be deposited inside the holes by means of a suitable technique, which includes atomic layer deposition, sputtering, electro-deposition, electrodeless deposition, and a wet chemical process. In the case of a dielectric material (such as Hafnium oxide or Aluminium oxide), a mono-layer can be accurately deposited onto the inside surface of the shaped structures by a process of atomic layer deposition. This guarantees the minimum separation distance between the charge transfer regions and the optically responsive particle.

Figure 27J:
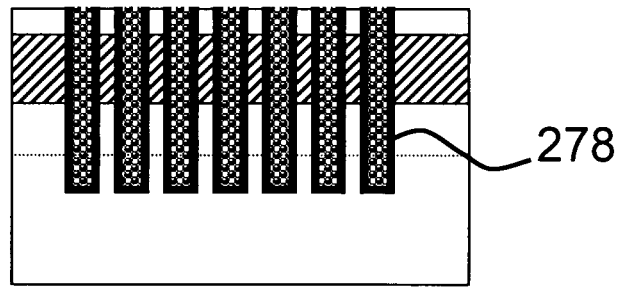

Following passivation, the top dielectric hard mask could be left in place to provide further protection to the top contact layer, thereby improving electrical performance and lifetime. Large windows would need to be etched through the top hard mask layer to allow electrical contact to the underlying metal stack. However, these windows can be some distance away from the active (light emissive/collection) surface of the device. Finally, as shown in FIG. 27J, optically responsive particle are disposed into the shaped voids by a suitable method, such as drop casting, dip pen lithograthy, spin coating, and the like.

Method of Design

All proposed embodiments of the invention can be designed utilising Finite difference time domain simulation techniques, whereby the model incorporates isolated dipole emitters, and also measures to prevent coherence effects within the simulation, such as illustrated in FIGS. 17, 19 and 25.

Applications

As has been indicated, the light emitting device of the present invention may be used as a single photon emitter or multi-photon device. The device can find application in display technologies and some embodiments can provide a laser device.

Similarly, the light harvesting device of the present invention may be used as a single photon absorbing or multi-photon absorbing device. The light harvesting device can find application solar cell technologies, photodetectors, and imaging devices such as Charged Coupled Devices (CCDs).

With regards to photodetectors and CCDs, the invention allows the extension of the device sensitivity to wavelengths which it would otherwise not be responsive, and can flatten the spectral response.

The invention claimed is:

1. An optical device having a surface for receiving light energy or for transmitting light energy, the device comprising:
    an electronic structure having an energy transfer region, wherein the electronic structure exhibits an electronic band gap with an associated energy;
    a plurality of cavities extending from the surface of the device through the electronic structure and penetrating the energy transfer region, each cavity having a predetermined cross-sectional shape with one or more corresponding sidewalls extending from the surface of the device through the electronic structure, wherein surfaces of the sidewalls are passivated to chemically terminate dangling bonds at the surfaces of the sidewalls; and
    a plurality of optically responsive particles disposed on at least one of the cavity sidewalls of each cavity in close spatial proximity to the energy transfer region, the plurality of optically responsive particles being adapted for:
        emitting light energy towards the surface of the device via the respective cavity; and
        energy transfer with the energy transfer region using a non-radiative energy transfer mechanism,
    wherein the electronic band gap energy of the electronic structure is greater than an electronic band gap energy of each optically responsive particle whereby, when an electric potential is applied to the electronic structure, energy is transferred non-radiatively to at least some of the optically responsive particles from the electronic structure via the energy transfer region through non-contact dipole-dipole interaction and is emitted as light energy by the at least some optically responsive particles;
    wherein the plurality of cavities is arranged in a two-dimensional periodic or quasi-periodic array across the surface of the device with nearest-neighbour separation distance less than twice a wavelength of emission of the optically responsive particles whereby to permit cross-coupling of electromagnetic optical fields generated by optically responsive particles between cavities and the width of adjoining material between nearest-neighbour cavities is a function of the electronic recombination distance of the electronic structure.

2. An optical device according to claim 1, wherein the electronic structure comprises an epitaxial structure.

3. An optical device according to claim 1, wherein the electronic structure comprises at least one p-n junction having a depletion region in the vicinity of the energy transfer region.

4. An optical device according to claim 1, wherein the electronic structure comprises a semiconductor heterostructure including at least one quantum well which provides for high mobility charge transfer in the vicinity of the energy transfer region, wherein at least some of the optically responsive particles are disposed in close spatial proximity to the at least one quantum well.

5. An optical device according to claim 1, wherein the electronic structure comprises a direct band gap semiconductor material.

6. An optical device according to claim 1, wherein the electronic structure comprises an indirect band gap semiconductor material.

7. An optical device according to claim 1, wherein each optically responsive particle comprises at least one of a direct band gap semiconductor material having a well defined shape, a quantum dot, and a quantum rod.

8. An optical device according to claim 1, wherein each optically responsive particle comprises a phosphor.

9. An optical device according to claim 1, wherein each optically responsive particle comprises a colloidal nanoparticle.

10. An optical device according to claim 1, wherein the one or more sidewalls of each cavity extend through the electronic structure perpendicular to the device surface.

11. An optical device according to claim 1, wherein the one or more sidewalls of each cavity are tapered.

12. An optical device according to claim 1, wherein the one or more sidewalls of each cavity are curved.

13. An optical device according to claim 1, wherein the predetermined cross-sectional shape of each cavity is one of a regular shape, a spiral shape, and a star shape.

14. An optical device according to claim 13, wherein the predetermined cross-sectional shape is fractal along its perimeter.

15. An optical device according to claim 1, wherein the plurality of cavities comprise a photonic crystal.

16. An optical device according to claim 1, wherein the plurality of cavities comprises a photonic quasi-crystal.

17. An optical device according to claim 1, wherein the plurality of cavities is arranged to optimise their packing density across the surface of the device.

18. An optical device according to claim 1, wherein the plurality of cavities is arranged across the surface of the device such that the spacing of nearest neighbour cavities is less than or equal to approximately twice the non-radiative carrier diffusion length of the electronic structure.

19. An optical device according to claim 1, wherein the device comprises a non-transparent electrical contact layer disposed over the surface of the device other than the or each cavity.

20. An optical device according to claim 1, wherein the device is a single photon device.

21. An optical device according to claim 1, wherein the cavity is configured to act as a reflector for reflecting light emitted by each optically responsive particle towards the surface of the device.

22. An optical device according to claim 1, wherein a depth of the cavity in the electronic structure is selected to optimise transmission of light from each optically responsive particle towards the surface of the device.

23. An optical device according to claim 1, wherein the plurality of cavities is configured to permit cross-coupling effects therebetween, whereby the device emits light having a predetermined far-field optical profile.

24. An optical device according to claim 1, wherein the plurality of cavities is configured to enhance emission rate via cross coupling between surface Plasmon modes on the surface of the device and the side walls of the cavities.

25. An optical device according to claim 1 wherein the plurality of cavities each comprise a passivation layer.

26. An optical device according to claim 25 wherein the passivation layers are deposited inside each cavity of the plurality of cavities.

27. An optical device according to claim 25 wherein the passivation layer provides a minimum separation distance between the energy transfer region and at least one of the optically responsive particles.

* * * * *